(12) United States Patent
Lin

(10) Patent No.: US 6,350,386 B1
(45) Date of Patent: Feb. 26, 2002

(54) METHOD OF MAKING A SUPPORT CIRCUIT WITH A TAPERED THROUGH-HOLE FOR A SEMICONDUCTOR CHIP ASSEMBLY

(76) Inventor: Charles W. C. Lin, 34 Pinewood Grove, Singapore 738290 (SG)

( * ) Notice: Subject to any disclaimer, the term of this patent is extended or adjusted under 35 U.S.C. 154(b) by 0 days.

(21) Appl. No.: 09/665,931

(22) Filed: Sep. 20, 2000

(51) Int. Cl.$^7$ ............................................ H01L 21/302
(52) U.S. Cl. ........................... 216/13; 216/19; 216/65; 216/100; 29/831; 29/847; 205/125; 205/920; 438/125
(58) Field of Search .................. 29/831, 847; 205/125, 205/920; 216/13, 19, 65, 100; 438/121, 125, 612, 613

(56) References Cited

U.S. PATENT DOCUMENTS

| | | | |
|---|---|---|---|
| 4,368,252 A | * 1/1983 | Kakuhashi et al. | 430/312 |
| 4,404,059 A | * 9/1983 | Livshits et al. | 156/629 |
| 4,442,967 A | 4/1984 | van de Pas et al. | 228/159 |
| 4,661,192 A | 4/1987 | McShane | 156/292 |
| 4,717,066 A | 1/1988 | Goldenberg et al. | 228/179 |
| 4,750,666 A | 6/1988 | Neugebauer et al. | 228/160 |
| 4,807,021 A | 2/1989 | Okumura | 357/75 |
| 4,925,083 A | 5/1990 | Farassat et al. | 228/102 |
| 4,937,653 A | 6/1990 | Blonder et al. | 357/68 |
| 4,955,523 A | 9/1990 | Calomagno et al. | 228/179 |
| 4,970,571 A | 11/1990 | Yamakawa et al. | 357/71 |
| 4,984,358 A | 1/1991 | Nelson | 29/830 |
| 5,014,111 A | 5/1991 | Tsuda et al. | 357/68 |
| 5,060,843 A | 10/1991 | Yasuzato et al. | 228/179 |

(List continued on next page.)

FOREIGN PATENT DOCUMENTS

| | | | |
|---|---|---|---|
| EP | 0 718 882 A1 | 6/1996 | H01L/23/057 |
| JP | 62-241345 | * 10/1987 | |
| WO | WO 97/38563 | 10/1997 | H05K/1/03 |
| WO | WO 99/57762 | * 11/1999 | H01L/23/48 |

OTHER PUBLICATIONS

Markstein et al., "Controlling the Variables in Stencil Printing," Electronic Packaging & Production, Feb. 1997, pp. 48–56.

(List continued on next page.)

Primary Examiner—Anita Alanko
(74) Attorney, Agent, or Firm—David M. Sigmond

(57) ABSTRACT

A method of manufacturing a support circuit includes providing a conductive layer with top and bottom surfaces, providing a top etch mask on the top surface that includes an opening that exposes a portion of the top surface, providing a bottom etch mask on the bottom surface that includes an opening that exposes a portion of the bottom surface, applying an etch to the exposed portion of the top surface through the opening in the top etch mask thereby etching partially but not completely through the conductive layer and forming a recessed portion in the conductive layer below the top surface, forming an insulative base on the recessed portion without forming the insulative base on the top surface, applying an etch to the exposed portion of the bottom surface through the opening in the bottom etch mask thereby forming a routing line in the recessed portion, applying an etch to the insulative base to form an opening in the insulative base that exposes a portion of the routing line, and applying an etch to the exposed portion of the routing line through the opening in the insulative base thereby forming an opening in the routing line with tapered sidewalls. The method may also include providing an adhesive beneath the support circuit, and applying an etch that enlarges the opening in the insulative base to expose a portion of a top surface of the routing line adjacent to the opening in the routing line and that forms an opening in the adhesive beneath the opening in the routing line.

50 Claims, 17 Drawing Sheets

U.S. PATENT DOCUMENTS

| | | | |
|---|---|---|---|
| 5,074,947 A | 12/1991 | Estes et al. | 156/307.3 |
| 5,090,119 A | 2/1992 | Tsuda et al. | 29/843 |
| 5,106,461 A | 4/1992 | Volfson et al. | 205/125 |
| 5,116,459 A * | 5/1992 | Kordus et al. | 156/631 |
| 5,116,463 A | 5/1992 | Lin et al. | 156/653 |
| 5,137,845 A | 8/1992 | Lochon et al. | 437/183 |
| 5,167,992 A | 12/1992 | Lin et al. | 427/437 |
| 5,172,851 A | 12/1992 | Matsushita et al. | 228/179 |
| 5,196,371 A | 3/1993 | Kulesza et al. | 437/183 |
| 5,209,817 A | 5/1993 | Ahmad et al. | 156/643 |
| 5,237,130 A | 8/1993 | Kulesza et al. | 174/260 |
| 5,260,234 A | 11/1993 | Long | 437/203 |
| 5,261,593 A | 11/1993 | Casson et al. | 228/180.22 |
| 5,275,330 A * | 1/1994 | Issacs et al. | 228/180.2 |
| 5,284,796 A * | 2/1994 | Nakanishi et al. | 437/183 |
| 5,293,067 A * | 3/1994 | Thompson et al. | 257/668 |
| 5,294,038 A | 3/1994 | Nakano et al. | 228/179.1 |
| 5,327,010 A * | 7/1994 | Uenaka et al. | 257/679 |
| 5,334,804 A * | 8/1994 | Love et al. | 174/267 |
| 5,346,750 A * | 9/1994 | Hatakeyama et al. | 428/209 |
| 5,355,283 A * | 10/1994 | Marrs et al. | 361/760 |
| 5,358,621 A * | 10/1994 | Oyama | 205/123 |
| 5,364,004 A | 11/1994 | Davidson | 228/1.1 |
| 5,397,921 A * | 3/1995 | Karnezos | 257/779 |
| 5,407,864 A * | 4/1995 | Kim | 437/203 |
| 5,424,245 A * | 6/1995 | Gurtler et al. | 438/183 |
| 5,438,477 A * | 8/1995 | Pasch | 361/689 |
| 5,439,162 A * | 8/1995 | George et al. | 228/180.22 |
| 5,447,886 A | 9/1995 | Rai | 437/183 |
| 5,454,161 A | 10/1995 | Beilin et al. | 29/852 |
| 5,454,928 A | 10/1995 | Rogers et al. | 205/125 |
| 5,475,236 A | 12/1995 | Yoshizaki | 257/48 |
| 5,477,933 A | 12/1995 | Nguyen | 174/262 |
| 5,478,007 A | 12/1995 | Marrs | 228/180.22 |
| 5,483,421 A | 1/1996 | Gedney et al. | 361/771 |
| 5,484,647 A | 1/1996 | Nakatani et al. | 428/209 |
| 5,485,949 A | 1/1996 | Tomura et al. | 228/180.5 |
| 5,487,218 A | 1/1996 | Bhatt et al. | 29/852 |
| 5,489,804 A | 2/1996 | Pasch | 257/778 |
| 5,493,096 A | 2/1996 | Koh | 219/121.71 |
| 5,508,229 A | 4/1996 | Baker | 437/183 |
| 5,525,065 A | 6/1996 | Sobhani | 439/67 |
| 5,536,973 A | 7/1996 | Yamaji | 257/737 |
| 5,542,601 A | 8/1996 | Fallon et al. | 228/119 |
| 5,547,740 A | 8/1996 | Higdon et al. | 428/209 |
| 5,556,810 A | 9/1996 | Fujitsu | 437/209 |
| 5,556,814 A | 9/1996 | Inoue et al. | 437/230 |
| 5,564,181 A | 10/1996 | Dineen et al. | 29/841 |
| 5,572,069 A | 11/1996 | Schneider | 257/669 |
| 5,576,052 A | 11/1996 | Arledge et al. | 427/98 |
| 5,583,073 A | 12/1996 | Lin et al. | 439/183 |
| 5,595,943 A | 1/1997 | Itabashi et al. | 437/230 |
| 5,599,744 A | 2/1997 | Koh et al. | 437/195 |
| 5,600,884 A * | 2/1997 | Kondo et al. | 29/852 |
| 5,611,140 A | 3/1997 | Kulesza et al. | 29/832 |
| 5,611,884 A | 3/1997 | Bearinger et al. | 156/325 |
| 5,613,296 A | 3/1997 | Kurino et al. | 29/852 |
| 5,614,114 A | 3/1997 | Owen | 219/121.66 |
| 5,615,477 A | 4/1997 | Sweitzer | 29/840 |
| 5,619,791 A | 4/1997 | Lambrecht, Jr. et al. | 29/852 |
| 5,627,405 A | 5/1997 | Chillara | 257/668 |
| 5,627,406 A | 5/1997 | Pace | 257/700 |
| 5,633,204 A | 5/1997 | Tago et al. | 438/614 |
| 5,637,920 A | 6/1997 | Loo | 257/700 |
| 5,641,113 A | 6/1997 | Somaki et al. | 228/180.22 |
| 5,645,628 A | 7/1997 | Endo et al. | 106/1.23 |
| 5,646,067 A | 7/1997 | Gaul | 437/180 |
| 5,648,686 A | 7/1997 | Hirano et al. | 257/778 |
| 5,653,891 A * | 8/1997 | Otsuki et al. | 216/11 |
| 5,654,584 A | 8/1997 | Fujitsu | 257/666 |
| 5,656,858 A | 8/1997 | Kondo et al. | 257/737 |
| 5,663,598 A | 9/1997 | Lake et al. | 257/737 |
| 5,665,652 A | 9/1997 | Shimizu | 438/127 |
| 5,666,008 A | 9/1997 | Tomita et al. | 257/778 |
| 5,669,545 A | 9/1997 | Pham et al. | 228/1.1 |
| 5,674,785 A | 10/1997 | Akram et al. | 437/217 |
| 5,674,787 A | 10/1997 | Zhao et al. | 437/230 |
| 5,682,061 A | 10/1997 | Khandros et al. | 257/666 |
| 5,686,353 A | 11/1997 | Yagi et al. | 437/183 |
| 5,691,041 A | 11/1997 | Frankeny et al. | 428/209 |
| 5,722,162 A | 3/1998 | Chou et al. | 29/852 |
| 5,723,369 A | 3/1998 | Barber | 438/106 |
| 5,731,223 A | 3/1998 | Padmanabhan | 437/183 |
| 5,736,456 A | 4/1998 | Akram | 438/614 |
| 5,739,585 A | 4/1998 | Akram et al. | 257/698 |
| 5,744,859 A | 4/1998 | Ouchida | 257/668 |
| 5,757,071 A | 5/1998 | Bhansali | 257/697 |
| 5,757,081 A | 5/1998 | Chang et al. | 257/778 |
| 5,764,486 A | 6/1998 | Pendse | 361/774 |
| 5,774,340 A | 6/1998 | Chang et al. | 361/771 |
| 5,789,271 A | 8/1998 | Akram | 438/18 |
| 5,798,285 A | 8/1998 | Bentlage et al. | 438/108 |
| 5,801,072 A | 9/1998 | Barber | 438/107 |
| 5,801,447 A | 9/1998 | Hirano et al. | 257/778 |
| 5,803,340 A | 9/1998 | Yeh et al. | 228/56.3 |
| 5,804,771 A | 9/1998 | McMahon et al. | 174/255 |
| 5,808,360 A | 9/1998 | Akram | 257/738 |
| 5,811,879 A | 9/1998 | Akram | 257/723 |
| 5,813,115 A | 9/1998 | Misawa et al. | 29/832 |
| 5,817,541 A | 10/1998 | Averkiou et al. | 438/107 |
| 5,822,856 A | 10/1998 | Bhatt et al. | 29/832 |
| 5,834,844 A | 11/1998 | Akagawa et al. | 257/734 |
| 5,861,666 A | 1/1999 | Bellaar | 257/686 |
| 5,863,816 A | 1/1999 | Cho | 438/123 |
| 5,870,289 A | 2/1999 | Tokuda et al. | 361/779 |
| 5,883,435 A | 3/1999 | Geffken et al. | 257/758 |
| 5,925,931 A | 7/1999 | Yamamoto | 257/737 |
| 5,994,222 A | 11/1999 | Smith et al. | 438/689 |
| 6,012,224 A | 1/2000 | DiStefano et al. | 29/840 |
| 6,013,877 A | 1/2000 | Degani et al. | 174/264 |
| 6,017,812 A | 1/2000 | Yonezawa et al. | 438/613 |
| 6,018,196 A | 1/2000 | Noddin | 257/777 |
| 6,020,561 A | 2/2000 | Ishida et al. | 174/261 |
| 6,037,665 A | 3/2000 | Miyazaki | 257/773 |
| 6,046,909 A | 4/2000 | Joy | 361/748 |
| 6,084,297 A | 6/2000 | Brooks et al. | 257/698 |
| 6,084,781 A | 7/2000 | Klein | 361/771 |
| 6,088,236 A | 7/2000 | Tomura et al. | 361/783 |
| 6,103,552 A | 8/2000 | Lin | 438/113 |
| 6,103,992 A | 8/2000 | Noddin | 219/121.71 |
| 6,127,204 A | 10/2000 | Isaacs et al. | 438/106 |
| 6,274,057 B1 * | 8/2001 | Sexton et al. | 216/27 |

OTHER PUBLICATIONS

Elenius, "Choosing a Flip Chip Bumping Supplier—Technology an IC Package contractor should look for," Advanced Packaging, Mar./Apr. 1998, pp. 70–73.

Erickson, "Wafer Bumping: The Missing Link for DCA," Electronic Packaging & Production, Jul. 1998, pp. 43–46.*

Kuchenmeister et al., "Film Chip Interconnection Systems Prepared By Wet Chemical Metallization," IEEE publication 0–7803–4526–6/98, Jun. 1998, 5 pages.*

Ghaffarian, "Long Time BGA Assembly Reliability," Advancing Microelectronics, vol. 25, No. 6, Sep./Oct. 1998, pp. 20–23.

U.S. Application Serial No. 09/465,024, filed Dec. 16, 1999, entitled "Bumpless Flip Chip Assembly With Solder Via".

U.S. Application Serial No. 09/464,562, filed Dec. 16, 1999, entitled "Bumpless Flip Chip Assembly with Strips and Via–Fill".

U.S. Application Serial No. 09/464,561, filed Dec. 16, 1999, entitled "Bumpless Flip Chip Assembly With Strips–In–Via and Plating".

U.S. Application Serial No. 09/120,408, filed Jul. 22, 1998, entitled "Flip Chip Assembly With Via Interconnection".

U.S. Application Serial No. 09/643,212, filed Aug. 22, 2000, entitled "Semiconductor Chip Assembly With Simultaneously Electroplated Contact Terminal and Connection Joint".

U.S. Application Serial No. 09/643,214, filed Aug. 22, 2000, entitled "Semiconductor Chip Assembly with Simultaneously Electrolessly Plated Contact Terminal and Connection Joint".

U.S. Application Serial No. 09/643,213, filed Aug. 22, 2000, entitled "Method of Making A Support Circuit for a Semiconductor Chip Assembly".

U.S. Application Serial No. 09/643,445, filed Aug. 22, 2000, entitled "Method of Making A Semiconductor Chip Assembly".

U.S. Application Serial No. 09/665,928, filed Sep. 20, 2000, entitled "Semiconductor Chip Assembly With Ball Bond Connection Joint".

* cited by examiner

METHOD OF MAKING A SUPPORT CIRCUIT WITH A TAPERED THROUGH-HOLE FOR A SEMICONDUCTOR CHIP ASSEMBLY

BACKGROUND OF THE INVENTION

1. Field of the Invention

The present invention relates generally to electrical substrates, and more particularly to a support circuit that can be connected to a semiconductor chip to provide a semiconductor chip assembly.

2. Description of the Related Art

Semiconductor chips have input/output pads that must be connected to external circuitry in order to function as part of an electronic system. The connection media is typically an array of metallic leads (e.g., a lead frame) or a support circuit (e.g., a substrate), although the connection can be made directly to a circuit panel (e.g., a mother board). Several connection techniques are widely used. These include wire bonding, tape automated bonding (TAB) and flip-chip bonding. Wire bonding is by far the most common. In this approach, wires are bonded, one at a time, from the chip to external circuitry by ultrasonic, thermocompression or thermosonic processes. TAB involves bonding gold-bumped pads on the chip to external circuitry on a polymer tape using thermocompression bonding. Both wire bonding and TAB require mechanical force such as pressure or a burst of ultrasonic vibration and elevated temperature to accomplish metallurgical welding between the wires or bumps and the designated surface.

Flip-chip bonding involves providing pre-formed solder bumps on the pads, flipping the chip so that the pads face down and are aligned with and contact matching bond sites, and melting the solder bumps to wet the pads and the bond sites. After the solder reflows it is cooled down and solidified to form solder joints between the pads and the bond sites. Organic conductive adhesive bumps with conductive fillers in polymer binders have been used in place of solder bumps, but they do not normally form a metallurgical interface in the classical sense. A major advantage of flip-chip bonding over wiring bonding and TAB is that it provides shorter connection paths between the chip and the external circuitry, and therefore has better electrical characteristics such as less inductive noise, cross-talk, propagation delay and waveform distortion. In addition, flip-chip bonding requires minimal mounting area and weight which results in overall cost saving since no extra packaging and less circuit board space are used.

While flip chip technology has tremendous advantages over wire bonding and TAB, its cost and technical limitations are significant. For instance, the cost of forming bumps on the pads is significant. In addition, an adhesive is normally underfilled between the chip and the support circuit to reduce stress on the solder joints due to thermal mismatch between the chip and the support circuit, and the underfilling process increases both manufacturing complexity and cost. Furthermore, the solder joints exhibit increased electrical resistance as well as cracks and voids over time due to fatigue from thermo-mechanical stresses. Finally, the solder is typically a tin-lead alloy and lead-based materials are becoming far less popular due to environmental concerns over disposing of toxic materials and leaching of toxic materials into ground water supplies.

Other techniques besides wire bonding, TAB and flip-chip bonding have been developed to connect chips to external circuitry without using wires, leads or bumps. Such techniques include thin film rerouting at the wafer, panel or module level, and attaching a pre-patterned substrate to the chip such that through-holes in the substrate expose the pads and selectively applying conductive material into the through-holes. Several approaches are described below.

A typical thin film routing approach includes depositing a dielectric material on the chip, providing through-holes in the dielectric material that expose the pads, providing metallization in the through-holes that contacts the pads, and providing a top layer of conductive circuitry on the dielectric material that contacts the metallization. In this manner, the additional circuitry is fabricated on the chip. Drawbacks to this approach include complicated manufacturing requirements, high cost, and chip loss if the additional circuitry is defective. In particular, since the chip or wafer provides a substrate for the additional circuitry, chips will be lost if the additional circuitry fails to achieve certain quality and yield criteria. Unpredictable chip loss has prevented the wide spread adoption of this "chip first" approach in volume production. Furthermore, if the process is not performed on wafers, the commercially available silicon wafer processing equipment may not be compatible with common tooling and handling techniques.

U.S. Pat. No. 5,407,864 discloses providing a partially assembled printed circuit board (PCB) with buried conductive traces and through-holes that expose portions of the conductive traces, attaching the PCB to the chip using an adhesive, removing portions of the adhesive exposed by the through-holes to expose the pads, depositing a blanket conductive layer over the PCB which covers the pads and sidewalls of the through-holes without filling the through-holes, depositing a blanket insulative layer over the PCB which fills the remaining space in tile through-holes, polishing the PCB to remove the conductive layer and the insulative layer from the top surface, and providing circuitry at the top surface that is connected to the conductive traces. In this manner, the circuitry at the top surface is connected to the pads through the conductive traces and portions of the conductive layer in the through-holes. Since, however, the conductive layer is blanket deposited over the entire PCB, polishing is used to remove the conductive layer from the top surface of the PCB since it would otherwise short the pads together. Polishing the conductive layer is costly and time consuming. Another drawback is that the polishing completely removes the top layer of the PCB, and therefore subsequent processes such as masking, circuitization and bumping are necessary for fabricating top surface circuitry such as traces and terminals for the next level assembly.

U.S. Pat. No. 6,037,665 discloses providing a chip with solder bumped pads, providing a pre-patterned multi-layer substrate with pre-metallized through-holes aligned with the pads, filling solder from the bumped pads into the through-holes, and reflowing the solder to form solder joint connections with the pads. This approach is similar to flip-chip bonding except that the solder is filled into the through-holes instead of merely being disposed between the chip and the substrate. Drawbacks to this approach include the need to solder bump the chip as well as the disadvantages of solder joints discussed above.

U.S. Pat. No. 5,116,463 discloses attaching a multi-layer substrate to a chip that includes forming through-holes through a dielectric layer that extend to the pads and electrolessly plating metal into the through-holes. The electroless plating is initiated by the pads and continues until the deposited metal fills the through-holes and contacts metallization on the top surface of the substrate. Drawbacks to this approach include the need for the metallization on the top surface to provide endpoint detection and the possibility that electroless plating on the metallization on the top surface adjacent to the top of the through-hole may close the through-hole before the electroless plating fills the through-hole.

U.S. Pat. No. 5,556,810 discloses inner leads laminated by an organic film and attached to a chip by an adhesive. Distal ends of the inner leads are positioned near the pads and then electrically connected to the pads by L-shaped plated metal. However, since the inner leads are flexible and vary in height and length, the inner leads may not be positioned precisely and uniformly, the gaps between the distal ends and the respective pads can vary, and consequently the plated metal joints may be weak or open. Furthermore, if the chip has moderate to high pad density and a separate power/ground plane is needed to achieve better electrical performance, the single layer inner leads may not be suitable. In addition, handling of this leaded-chip for the next level assembly such as outer lead bonding or board level assembly can be problematic since the leads are soft and easily bent, rendering it difficult to maintain co-planarity among the leads during the next level assembly.

Recent introduction of grid array packaging (e.g., ball grid arrays), chip size packages (CSP) and flip-chip packages using high density interconnect substrates are relentlessly driving increased printed circuit board density. Shrinking traces and spaces and increasing layer count increase printed circuit board density, however reducing the size of plated through-holes can even more significantly increase printed circuit board density. Small through-holes allow more routing space so that more conductive lines can be placed between the through-holes. Small throughholes also increase design flexibility and reduce design cycle time and overall product introduction time.

Conventional printed circuit boards have drilled through-holes with a size (diameter) in the range of 200 to 400 microns. As drilling technology improves, the drilled through-hole size is anticipated to reach 100 microns. Moreover, recently developed methods for forming through-holes using a punch, plasma or laser have driven down through-hole size to the range of 50 microns or less. A typical chip pad has a length and width on the order of 50 to 100 microns. Since the through-holes allow the pads to interconnect with various circuitry layers, using through-holes with similar sizes to the pads is desirable. The major advantage of using metallization in through-holes to interconnect the pads is that it replaces external media such as wires, bumps and leads.

The semiconductor chip assembly is subsequently connected to another circuit such as a PCB or mother board during next level assembly. Different semiconductor assemblies are connected to the next level assembly in different ways. For instance, ball grid array (BGA) packages contain an array of solder balls, and land grid array (LGA) packages contain an array of metal pads that receive corresponding solder traces on the PCB. However, since BGA and LGA packages are connected to the PCB by solder joints, the compliance is small and solder joint reliability problems exist. Plastic quad flat pack (PQFP) packages have a lead frame formed into a gull-wing shape. When the PQFP is assembled on a PCB, this gull-wing lead serves as the contact terminal which provides compliance and reduces stress on the solder joints. However, drawbacks to PQFP packages include the large size of the lead and poor high frequency electrical characteristics.

Thermo-mechanical wear or creep of the solder joints that connect the semiconductor chip assembly to the next level assembly is a major cause of failure in most board assemblies. This is because non-uniform thermal expansion and/or contraction of different materials causes mechanical stress on the solder joints.

Thermal mismatch induced solder joint stress can be reduced by using materials having a similar coefficient of thermal expansion (CTE). However, due to large transient temperature differences between the chip and other materials during power-up of the system, the induced solder joint stress makes the assembly unreliable even when the chip and the other materials have closely matched thermal expansion coefficients.

Thermal mismatch induced solder joint stress can also be reduced by proper design of the support circuit. For instance, BGA and LGA packages have been designed with pillar post type contact terminals that extend above the package and act as a stand-off or spacer between the package and the PCB in order to absorb thermal stress and reduce solder joint fatigue. The higher the aspect ratio of the pillar, the more easily the pillar can flex to follow expansion of the two ends and reduce shear stress.

Conventional approaches to forming the pillar either on a wafer or a separate support circuit include a bonded interconnect process (BIP) and plating using photoresist.

BIP forms a gold ball on a pad of the chip and a gold pin extending upwardly from the gold ball using a thermocompression wire bonder. Thereafter, the gold pin is brought in contact with a molten solder bump on a support circuit, and the solder is reflowed and cooled to form a solder joint around the gold pin. A drawback to this approach is that when the wire bonder forms the gold ball on the pad it applies substantial pressure to the pad which might destroy active circuitry beneath the pad. In addition, gold from the pin can dissolve into the solder to form a gold-tin intermetallic compound which mechanically weakens the pin and therefore reduces reliability.

U.S. Pat. No 5,722,162 discloses fabricating a pillar by electroplating the pillar on a selected portion of an underlying metal exposed by an opening in photoresist and then stripping the photoresist. Although it is convenient to use photoresist to define the location of the pillar, electroplating the pillar in an opening in the photoresist has certain drawbacks. First, the photoresist is selectively exposed to light that initiates a reaction in regions of the photoresist that correspond to the desired pattern. Since photoresist is not fully transparent and tends to absorb the light, the thicker the photoresist, the poorer the penetration efficiency of the light. As a result, the lower portion of the photoresist might not receive adequate light to initiate or complete the intended photo-reaction. Consequently, the bottom portion of the opening in the photoresist might be too narrow, causing a pillar formed in the narrowed opening to have a diameter that decreases with decreasing height. Such a pillar has a high risk of fracturing at its lower portion in response to thermally induced stress. Second, if the photoresist is relatively thick (such as 100 microns or more), the photoresist may need to be applied with multiple coatings and receive multiple light exposures and bakes, which increases cost and reduces yield. Third, if the photoresist is relatively thick, the electroplated pillar may be non-uniform due to poor current density distribution in the relatively deep opening. As a result, the pillar may have a jagged or pointed top surface instead of a flat top surface that is better suited for providing a contact terminal for the next level assembly.

In view of the various development stages and limitations in currently available support circuits for semiconductor chip assemblies, there is a need for a support circuit that is cost-effective, reliable, manufacturable, provides excellent mechanical and electrical performance, and complies with stringent environmental standards.

SUMMARY OF THE INVENTION

An object of the present invention is to provide a support circuit adapted for semiconductor chip assemblies such as chip size packages, ball grid arrays or other structures.

Another object of the present invention is to provide a convenient, costeffective method for manufacturing a support circuit for use in a low cost, high performance, high reliability package.

In accordance with one aspect of the invention, a method of manufacturing a support circuit includes providing a conductive layer with top and bottom surfaces, providing a top etch mask on the top surface that includes an opening that exposes a portion of the top surface, providing a bottom etch mask on the bottom surface that includes an opening that exposes a portion of the bottom surface, applying an etch to the exposed portion of the top surface through the opening in the top etch mask thereby etching partially but not completely through the conductive layer and forming a recessed portion in the conductive layer below the top surface, forming an insulative base on the recessed portion without forming the insulative base on the top surface, applying an etch to the exposed portion of the bottom surface through the opening in the bottom etch mask thereby forming a routing line in the recessed portion, applying an etch to the insulative base to form an opening in the insulative base that exposes a portion of the routing line, and applying an etch to the exposed portion of the routing line through the opening in the insulative base thereby forming an opening in the routing line with tapered sidewalls.

Preferably, the method includes applying the etch to the exposed portion of the top surface, then providing the insulative base, then applying the etch to the exposed portion of the bottom surface, then providing the opening in the insulative base, then applying the etch to the exposed portion of the routing line.

It is also preferred that the opening in the routing line has a diameter that increases with increasing height, the tapered sidewalls have a slope of about 45 to 75 degrees, the pillar extends above the routing line at least twice the distance that the insulative base extends above the routing line, and the pillar has a diameter that decreases with increasing height.

The method may include simultaneously forming the etch masks and then simultaneously stripping the etch masks after applying the etches to the exposed portions of the top and bottom surfaces.

The method may also include applying an etch that enlarges the opening in the base after forming the opening in the routing line, thereby exposing a portion of a top surface of the routing line adjacent to the tapered sidewalls and exposing an upper portion of the tapered sidewalls.

The method may further include covering the bottom surface with an adhesive and applying the etch that enlarges the opening in the base so as to at least partially form an opening in an adhesive below the opening in the routing line.

An advantage of the present invention is that the opening in the routing line with the tapered sidewalls is particularly well-suited to receive a ball bond connection joint applied by wire bonding that contacts both the tapered sidewalls and an underlying pad on a chip. Another advantage is that the pillar is formed using etching (i.e., subtractively) rather than by electroplating or electroless plating (i.e., additively) which improves uniformity and reduces manufacturing time and cost. Another advantage is that the support circuit can be manufactured using low temperature processes which reduces stress and improves reliability. A further advantage is that the support circuit can be manufactured using well-controlled wet chemical processes which can be easily implemented by circuit board, lead frame and tape manufacturers. Still another advantage is that the support circuit can be manufactured using materials that are compatible with copper chip and lead-free environmental requirements.

These and other objects, features and advantages of the invention will be further described and more readily apparent from a review of the detailed description of the preferred embodiments which follows.

BRIEF DESCRIPTION OF THE DRAWINGS

The following detailed description of the preferred embodiments can best be understood when read in conjunction with the following drawings, in which.

DETAILED DESCRIPTION OF THE PREFERRED EMBODIMENTS

FIGS. 1A–1N, 2A–2N and 3A–3N are cross-sectional, top and bottom views, respectively, of a method of manufacturing a support circuit in accordance with an embodiment of the present invention.

Figure 1A:
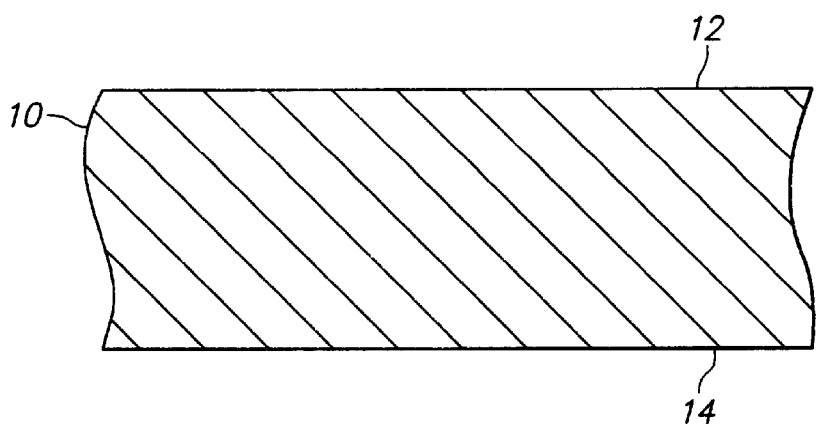
FIGS. 1A–1N are cross-sectional views showing a method of manufacturing a support circuit in accordance with an embodiment of the present invention.
Figure 2A:
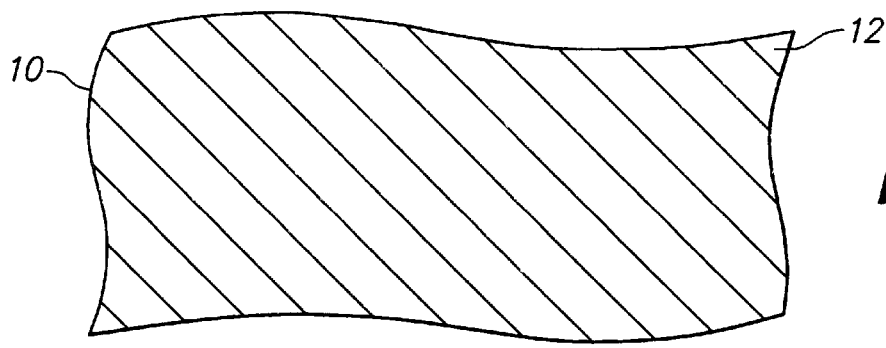
FIGS. 2A–2N are top plan views corresponding to FIGS. 1A–1N, respectively.
Figure 3A:
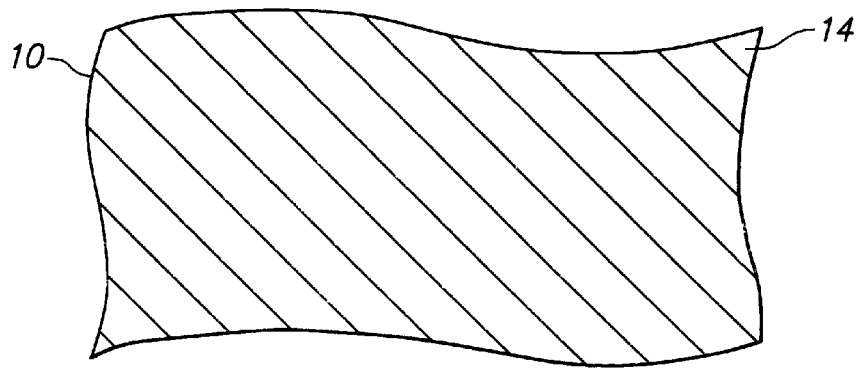
FIGS. 3A–3N are bottom plan views corresponding to FIGS. 1A–1N, respectively.

FIGS. 1A, 2A and 3A are cross-sectional, top and bottom views, respectively, of copper foil 10 which includes top surface 12 and bottom surface 14. Copper foil 10 has a thickness of 150 microns.

Figure 1B:
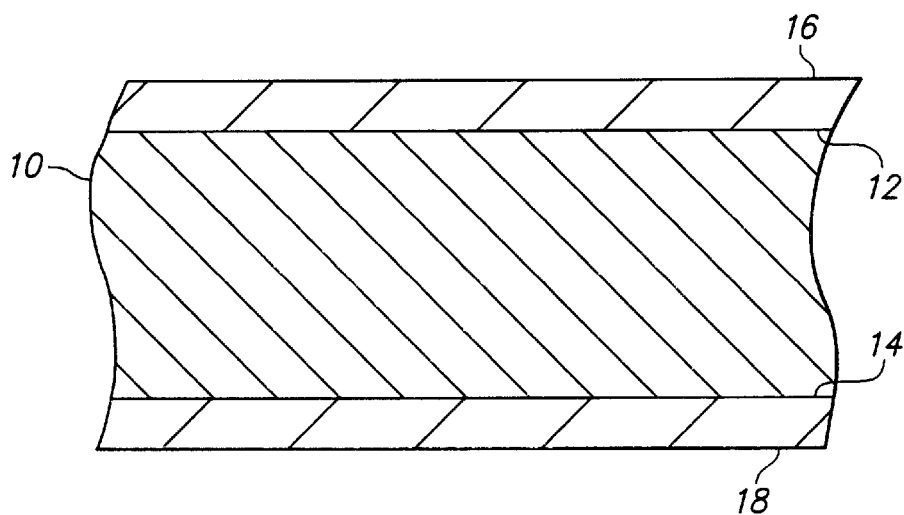
FIGS. 1O–1P are cross-sectional views showing a method of manufacturing a semiconductor chip assembly in accordance with an embodiment of the present invention.
Figure 2B:
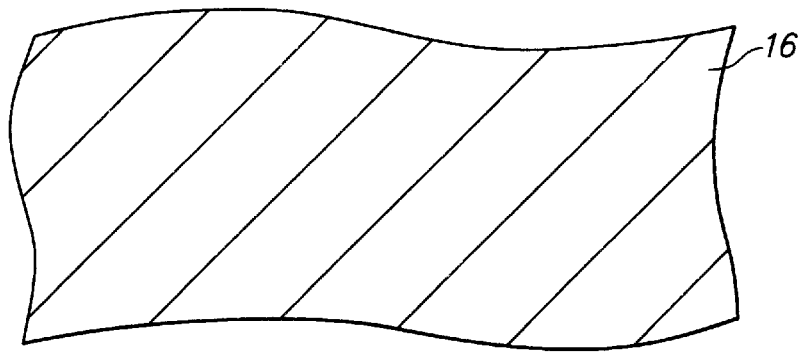
FIGS. 2O–2P are top plan views corresponding to FIGS. 1O–1P, respectively.
Figure 3B:
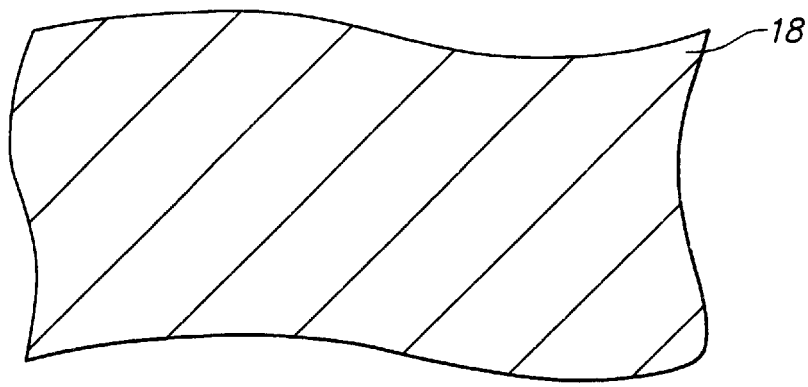
FIGS. 3O–3P are bottom plan views corresponding to FIGS. 1O–1P, respectively.

FIGS. 1B, 2B and 3B are cross-sectional, top and bottom views, respectively, of top photoresist layer 16 and bottom photoresist layer 18 formed on copper foil 10. Top photoresist layer 16 is deposited on top surface 12, and bottom photoresist layer 18 is deposited on bottom surface 14 using a dry film lamination process in which hot rolls simultaneously press photoresist layers 16 and 18 onto top and bottom surfaces 12 and 14, respectively. Photoresist layers 16 and 18 each have a thickness of 10 microns.

Figure 1C:
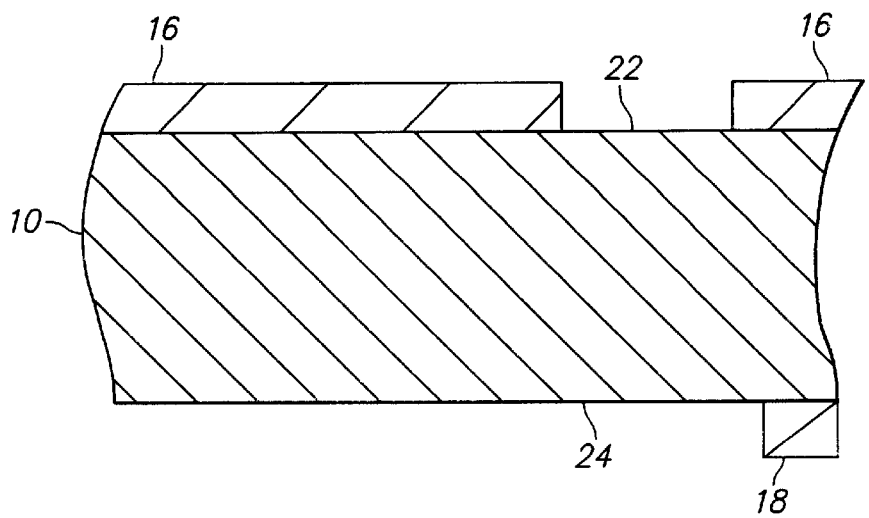
Figure 2C:
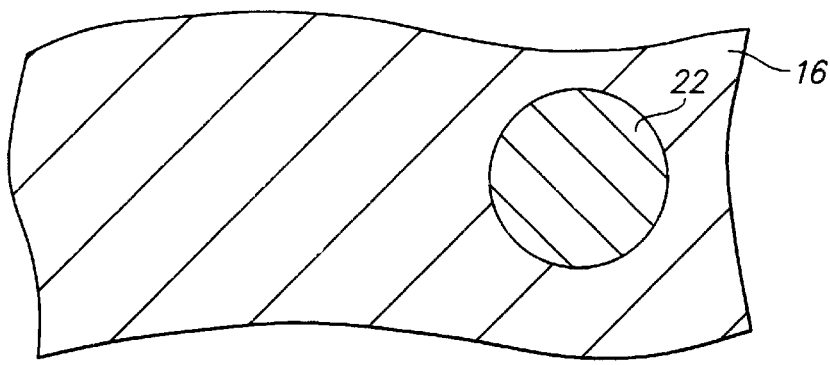
Figure 3C:
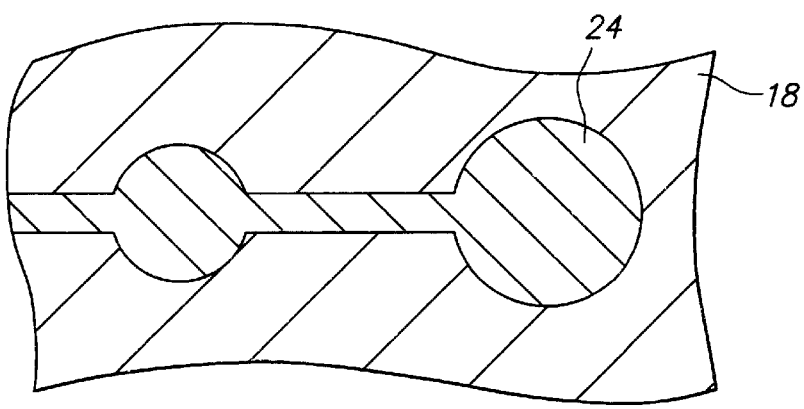

FIGS. 1C, 2C and 3C are cross-sectional, top and bottom views, respectively, of top and bottom photoresist layers 16 and 18 after they are patterned to selectively expose portions of top and bottom surfaces 12 and 14, respectively. Photoresist layers 16 and 18 are simultaneously patterned by selectively applying light through reticles (not shown), applying a developer solution to remove the photoresist portions rendered soluble by the light, and then hard baking, as is conventional. As a result, photoresist layer 16 contains an opening that selectively exposes portion 22 of top surface 12, and photoresist layer 18 contains an opening that selectively exposes portion 24 of bottom surface 14.

Figure 1D:
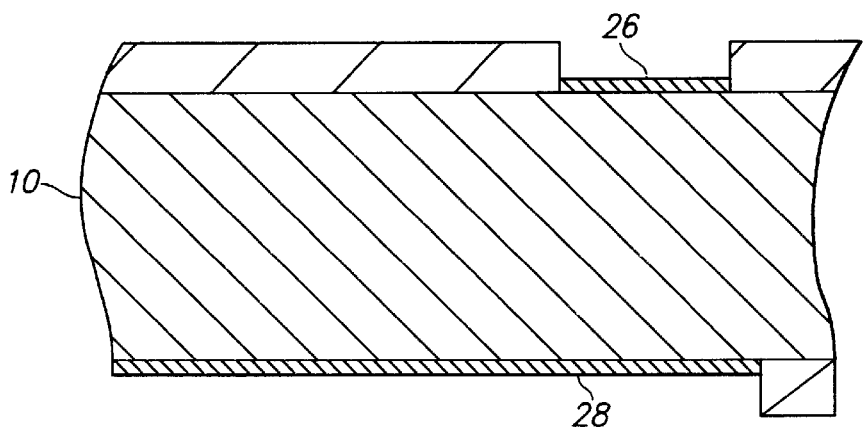
Figure 2D:
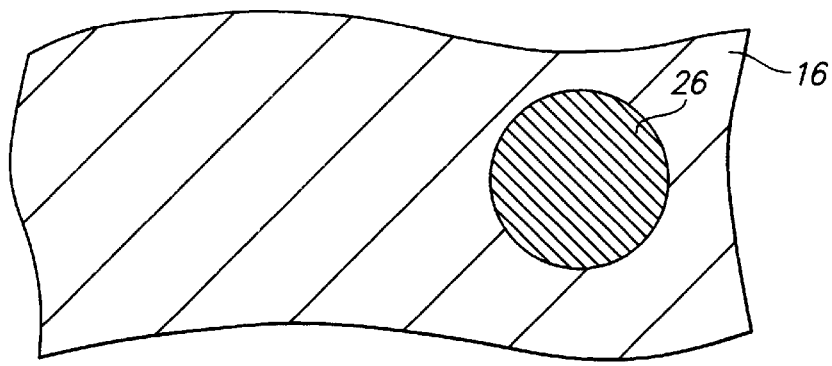
Figure 3D:
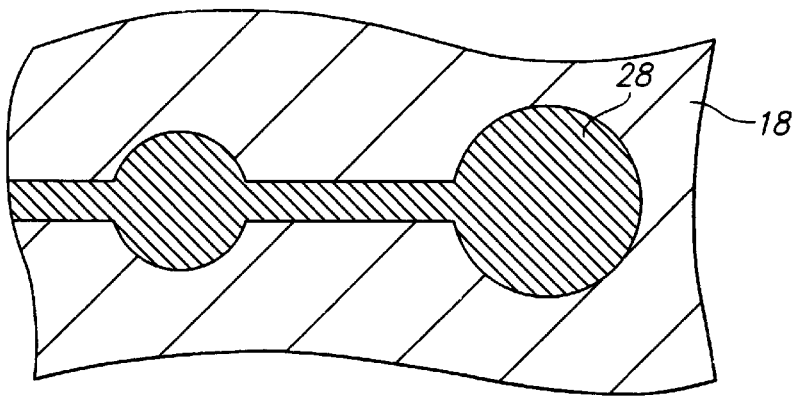

FIGS. 1D, 2D and 3D are cross-sectional, top and bottom views, respectively, of nickel etch mask 26 and nickel etch mask 28 formed on copper foil 10. Nickel 10 etch masks 26 and 28 are simultaneously electroplated onto portions 22 and 24, respectively, of top and bottom surfaces 12 and 14, respectively. Nickel etch masks 26 and 28 each have a thickness of 0.5 microns.

Figure 1E:
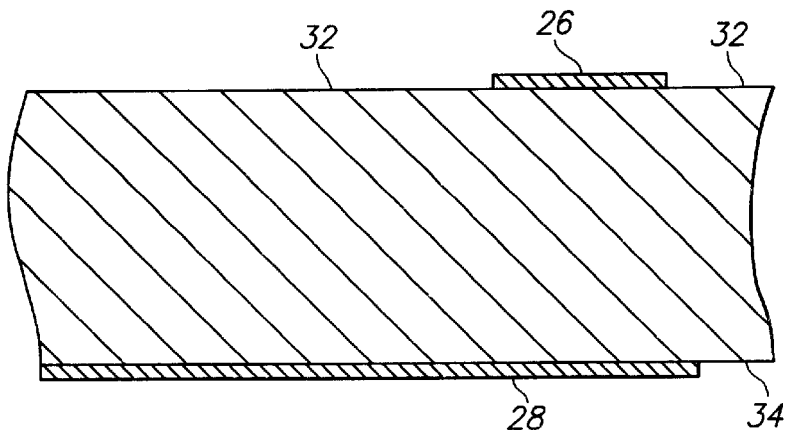
Figure 2E:
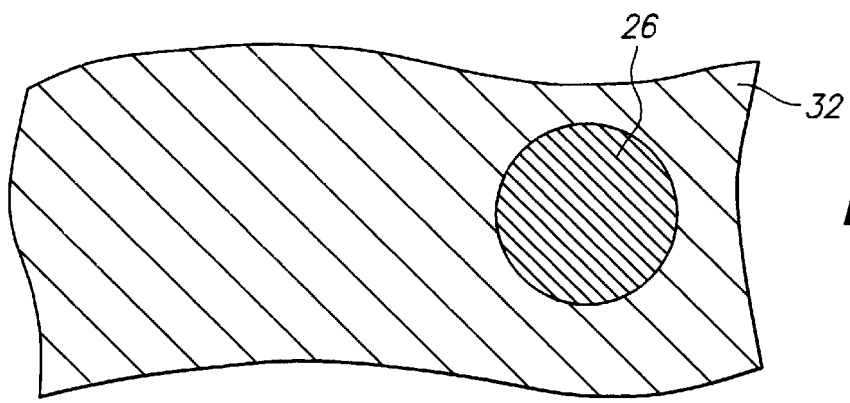
Figure 3E:
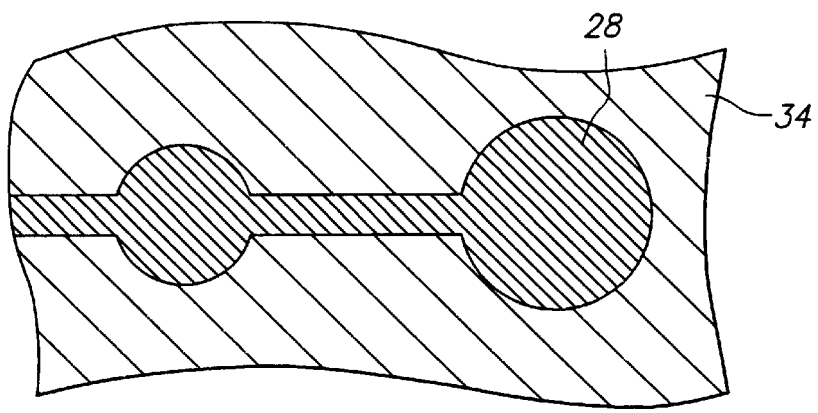

FIGS. 1E, 2E and 3E are cross-sectional, top and bottom views, respectively, of copper foil 10 and nickel etch masks 26 and 28 after photoresist layers 16 and 18 are stripped. As is seen, portions 32 and 34 of top and bottom surfaces 12 and 14, respectively, that had previously been covered by photoresist layers 16 and 18, respectively, and that are outside nickel etch masks 26 and 28, respectively, are now exposed.

Figure 1F:
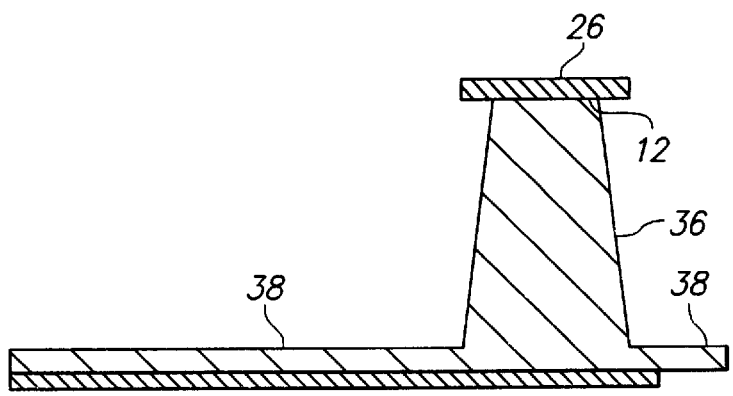
Figure 2F:
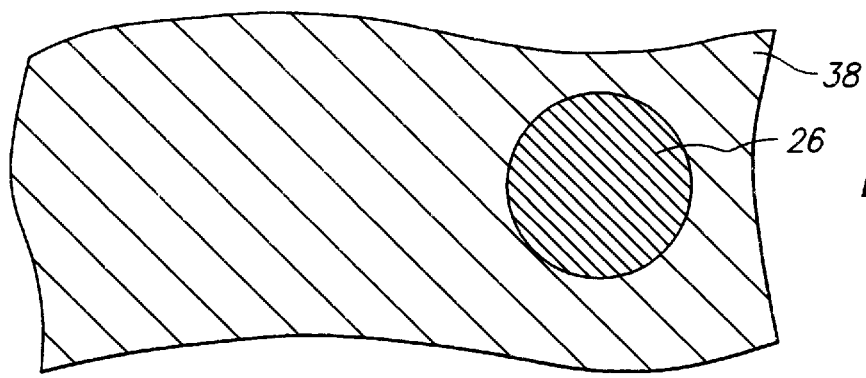
Figure 3F:
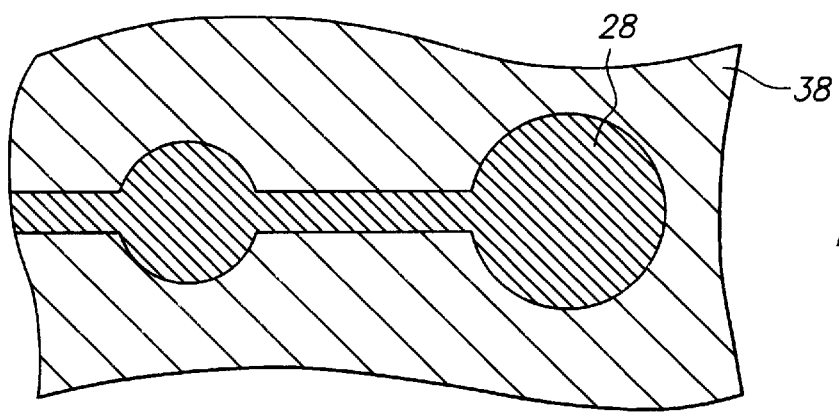

FIGS. 1F, 2F and 3F are cross-sectional, top and bottom views, respectively, of pillar 36 formed in copper foil 10. Pillar 36 is formed by applying a "front-side" wet chemical etch to portion 32 of top surface 12 without applying the wet chemical etch to the opposite or back-side (including nickel etch mask 28 and portion 34 of bottom surface 14). For instance, the wet chemical etch can be sprayed on the front-side, or the back-side can be covered by a mask and then the structure can be dipped in the wet chemical etch. Thus, pillar 36 is formed subtractively. The wet chemical etch is highly selective of copper with respect to nickel, and therefore no appreciable amount of nickel etch mask 26 is removed. A suitable wet chemical etch can be provided by a solution containing alkaline ammonia, sulfuric acid with hydrogen peroxide, chromic-sulfuric acid, phosphoric acid with ammonium persulfate, copper sulfate, copper chloride or ferric chloride. The wet chemical etch does not etch completely through copper foil 10. Rather, the wet chemical etch etches partially through copper foil 10. In this instance, the wet chemical etch removes an upper thickness of 125 microns from copper foil 10. Since copper foil 10 is 150 microns thick, the wet chemical etch forms recessed portion 38 in copper foil 10 that is outside pillar 36 and is 25 microns thick. Thus, pillar 36 extends to top surface 12 whereas recessed portion 38 does not. Furthermore, since the wet chemical etch undercuts (i.e., laterally etches) copper foil 10 beneath nickel etch mask 26, pillar 36 tapers inwardly with increasing height. A suitable taper is between 45 and slightly less than 90 degrees, such as approximately 75 degrees. Pillar 36 has a diameter of 400 microns that decreases with increasing height and is narrowest at top surface 12. Furthermore, pillar 36 has a flat top surface at what remains of top surface 12. The optimal etch time for exposing portion 32 of top surface 12 to the wet chemical etch in order to form pillar 36 and recessed portion 38 with the desired dimensions can be established through trial and error.

Figure 1G:
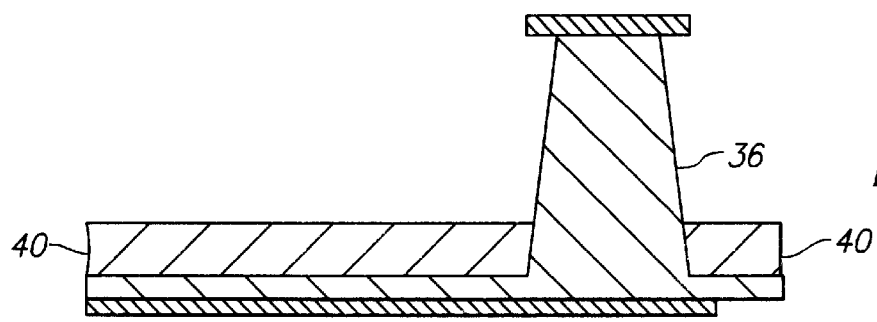
Figure 2G:
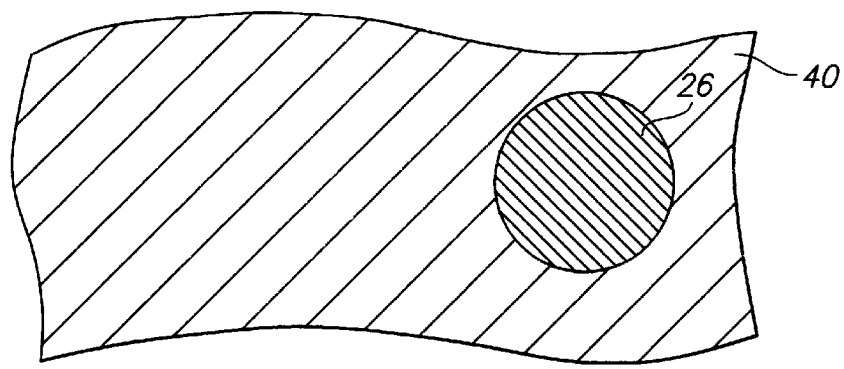
Figure 3G:
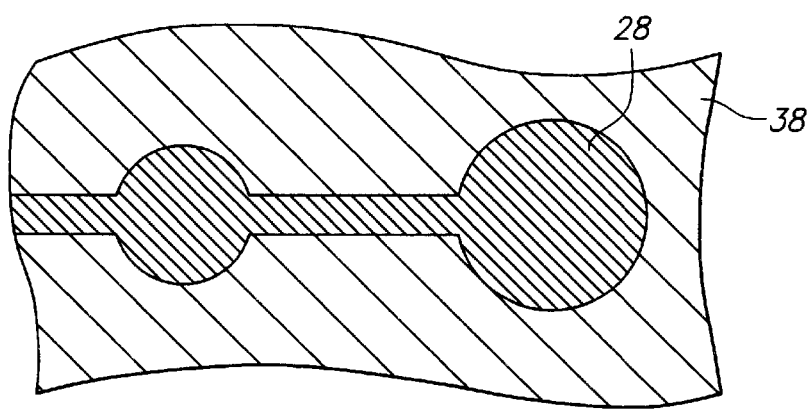

FIGS. 1G, 2G and 3G are cross-sectional, top and bottom views, respectively, of insulative base 40 formed on recessed portion 38 of copper foil 10. Insulative base 40 is relatively flat and has a thickness of 50 microns. Therefore, although insulative base 40 covers and adheres to recessed portion 38 and the lower portion of pillar 36, pillar 36 extends 75 microns above insulative base 40. Thus, insulative base 40 does not extend to top surface 12. Preferably, insulative base 40 is initially an epoxy in paste form that includes an epoxy resin, a curing agent, an accelerator and a filler. The filler is an inert material, such as silica (powdered fused quartz), that improves thermal conductivity, thermal shock resistance, and thermal coefficient r of expansion matching. The epoxy paste is selectively coated onto recessed portion 38 but not nickel etch mask 26 or top surface 12 using screen printing, and then the epoxy is cured or hardened at relatively low temperature in the range of 100–250° C. to form a solid adherent insulative layer.

Figure 1H:
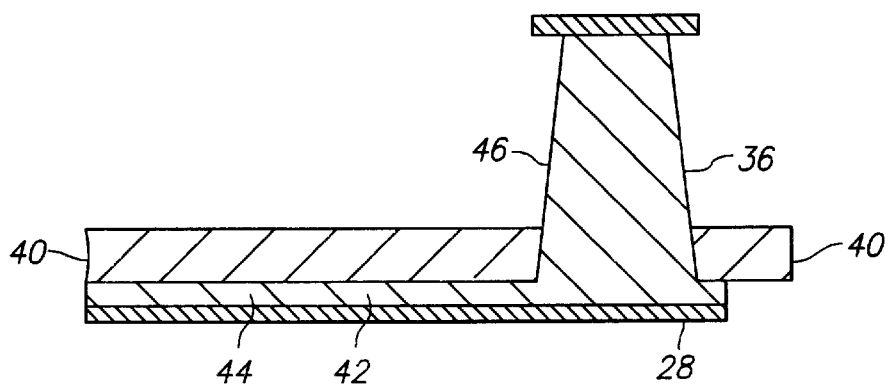
Figure 2H:
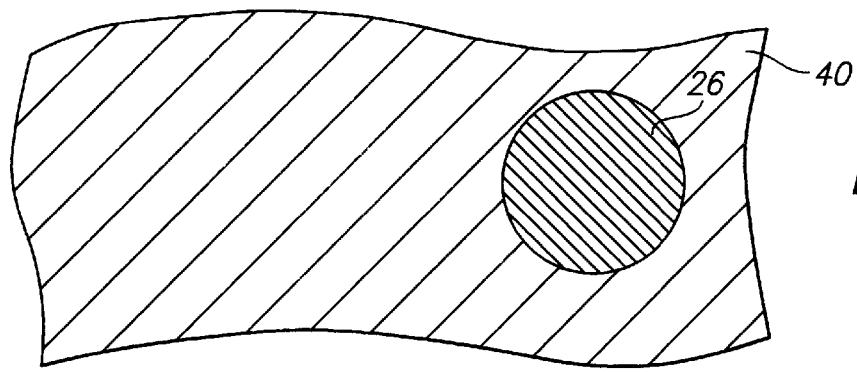
Figure 3H:
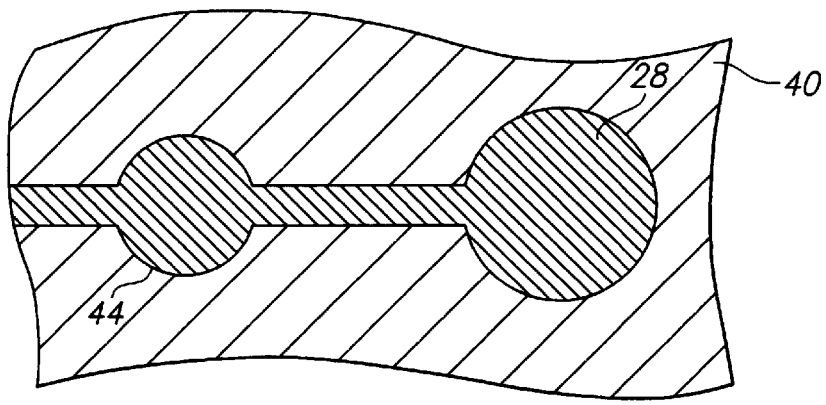

FIGS. 1H, 2H and 3H are cross-sectional, top and bottom views, respectively, of routing line 42 formed in recessed portion 38. Routing line 42 is formed by applying a "backside" wet chemical etch to portion 34 of bottom surface 14 without applying the wet chemical etch to the opposite or front-side (including nickel etch mask 26, pillar 36 and the top surface of insulative base 40). Thus, routing line 42 is formed subtractively. The wet chemical etch is highly selective of copper with respect to nickel, and therefore no appreciable amount of nickel etch mask 28 is removed. Furthermore, the wet chemical etch is highly selective of copper with respect to epoxy, and therefore, after the wet chemical etch etches through portion 34 of bottom surface 14 and contacts insulative base 40, no appreciable amount of insulative base 40 is removed. A suitable wet chemical etch can be provided by a solution containing alkaline ammonia, sulfuric acid with hydrogen peroxide, chromicsulfuric acid, phosphoric acid with ammonium persulfate, copper sulfate, copper chloride or ferric chloride. The wet chemical etch etches completely through recessed portion 38. Thus, routing line 42 constitutes a remaining portion of recessed portion 38 after the etch is applied. Furthermore, routing line 42 includes an enlarged circular region 44. Routing line 42 has a width of 50 microns and a thickness of 25 microns, and enlarged circular region 44 has a diameter of 150 microns. Pillar 36 is not affected by the etch, although the etch removes regions of recessed portion 38 near the base of pillar 36. Thus, pillar 36 extends to top surface 12 whereas routing line 42 does not. In addition, pillar 36 is horizontally offset from enlarged circular region 44, and routing line 42 provides horizontal routing (fan-in or fan-out) between pillar 36 and enlarged circular region 44. Pillar 36 and routing line 42 in combination provide conductive trace 46 that is adapted for providing horizontal and vertical routing between a pad on a semiconductor chip (beneath bottom surface 14) and a terminal on a printed circuit board (above top surface 12) in a subsequent assembly. Advantageously, conductive trace 46 is a single continuous copper segment that is devoid of plated copper. At this stage, insulative base 40 provides critical mechanical support for conductive trace 46 which would otherwise be a dangling lead.

Figure 1I:
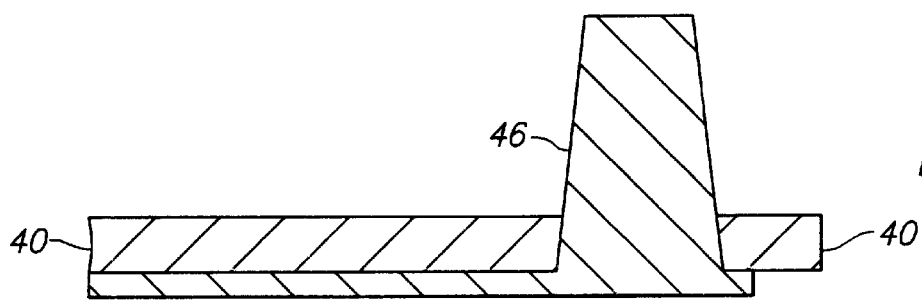
Figure 2I:
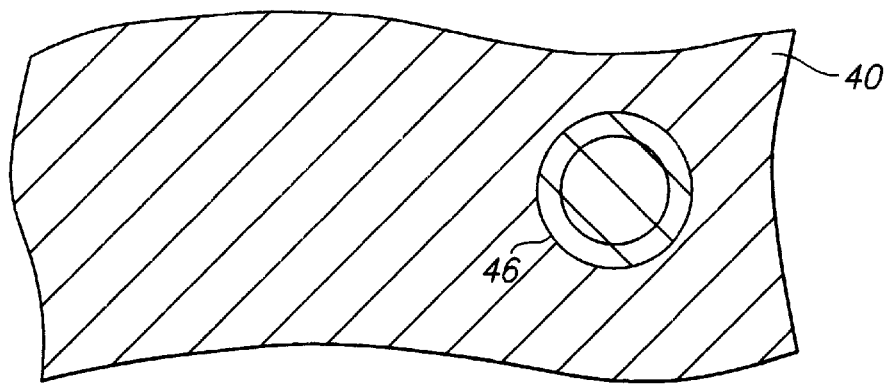
Figure 3I:
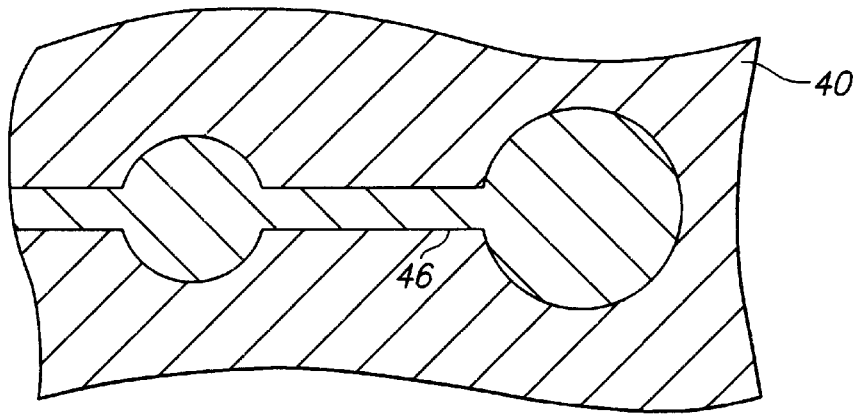

FIGS. 1I, 2I and 3I are cross-sectional, top and bottom views, respectively, of insulative base 40 and conductive trace 46 after nickel etch masks 26 and 28 are stripped. Nickel etch masks 26 and 28 are stripped using a conventional nickel etching solution that is highly selective of nickel with respect to epoxy. In addition, since nickel etch masks 26 and 28 are extremely thin relative to conductive trace 46, and the nickel etching solution is removed immediately after nickel etch masks 26 and 28 are stripped, it is not critical that the nickel etching solution be highly selective of nickel with respect to copper. Therefore, no appreciable amount of insulative base 40 or conductive trace 46 is removed. Furthermore, portions of top and bottom surfaces 12 and 14, respectively, that had previously been covered by nickel etch masks 26 and 28, respectively, are now exposed. A suitable nickel etching solution is a dilute mixture of nitric and hydrochloric acid.

Figure 1J:
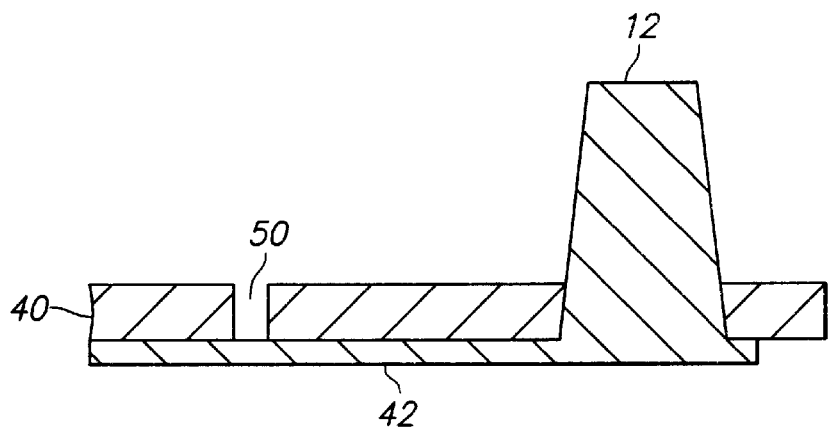
Figure 2J:
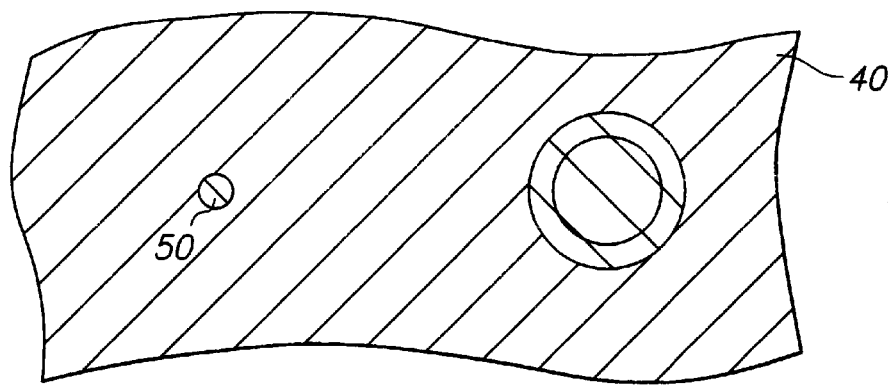
Figure 3J:
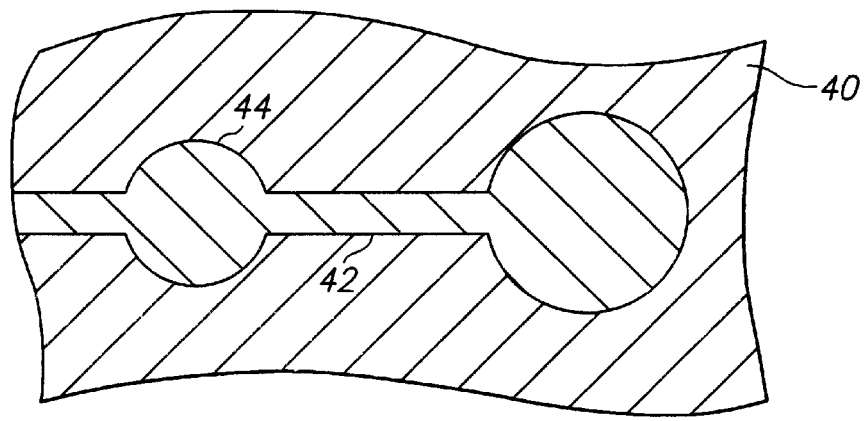

FIGS. 1J, 2J and 3J are cross-sectional, top and bottom views, respectively, of opening 50 in insulative base 40 that exposes routing line 42 from the front-side. In particular, a metal mask (not shown) is positioned above top surface 12 such that an opening in the metal mask is aligned with enlarged circular region 44, and a laser is directed to the side of the metal mask opposite top surface 12. Accordingly, the metal mask targets the laser at a central portion of enlarged circular region 44. The laser removes a portion of insulative base 40 above the central portion of enlarged circular region 44, thereby forming opening 50 with a diameter of 30 microns. This laser etch technique is commonly known as projection laser ablation and is analogous to how a photolithographic stepper selectively exposes a photoresist layer to light. Opening 50 is substantially axially aligned with enlarged circular region 44, and therefore exposes the central portion of circular region 44 without exposing the peripheral portion of circular region 44. The laser does not deform or remove an appreciable amount of routing line 42. In fact, routing line 42 (and more particularly enlarged circular region 44) is the only portion of the support circuit that provides an etch stop for the laser.

Figure 1K:
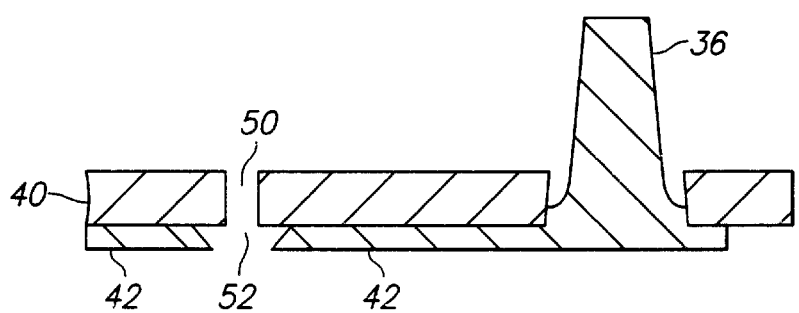
Figure 2K:
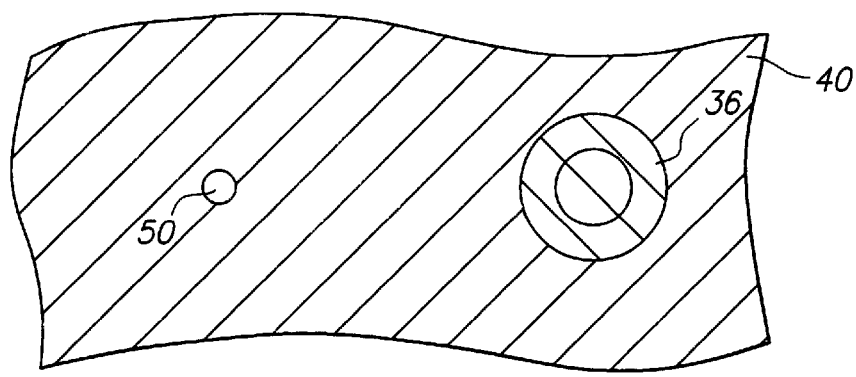
Figure 3K:
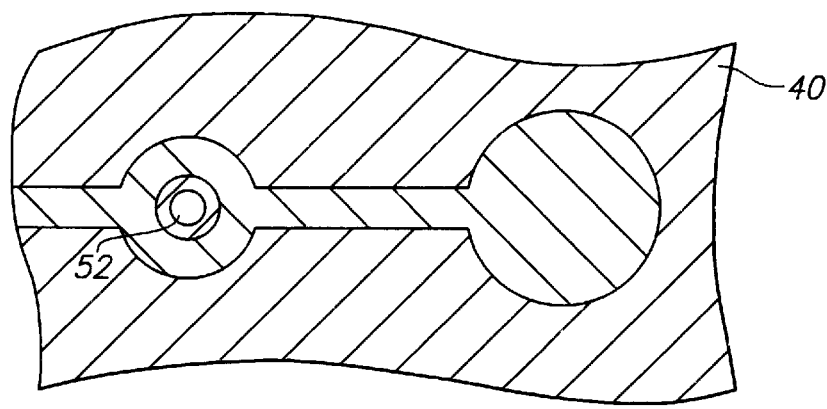

FIGS. 1K, 2K and 3K are cross-sectional, top and bottom views, respectively, of opening 52 formed in routing line 42. Opening 52 is formed by applying a "front-side" wet chemical etch to the portion of routing line 42 exposed by opening 50 without applying the wet chemical etch to the back-side (other than whatever portion of the back-side the wet chemical etch eventually eats its, way to). The wet chemical etch is highly selective of copper with respect to epoxy, and therefore no appreciable amount of insulative base 40 is removed. However, since pillar 36 is copper, the wet chemical etch removes about 25 microns from the exposed surfaces of pillar 36. Furthermore, since the wet chemical etch undercuts routing line 42 beneath insulative base 40, opening 52 tapers outwardly with increasing height. That is, the diameter of opening 52 increases as the height of opening 52 increases. A suitable taper for the sidewalls of opening 52 is between 45 and 75 degrees, such as approximately 45 degrees. Thus, opening 52 has a conical shape. Opening 52 has a diameter of 100 microns at the top surface of routing line 42, a diameter of 50 microns at the bottom surface of routing line 42, and a continuous taper therebetween. In addition, the tapered sidewalls of opening 52 are directly beneath insulative base 40. A suitable wet chemical etch can be provided by a solution containing alkaline ammonia, sulfuric acid with hydrogen peroxide, chromic-sulfuric acid, phosphoric acid with ammonium persulfate, copper sulfate, copper chloride or ferric chloride. The optimal etch time to form opening 52 with the desired dimensions and sidewall slopes can be established through trial and error.

Figure 1L:
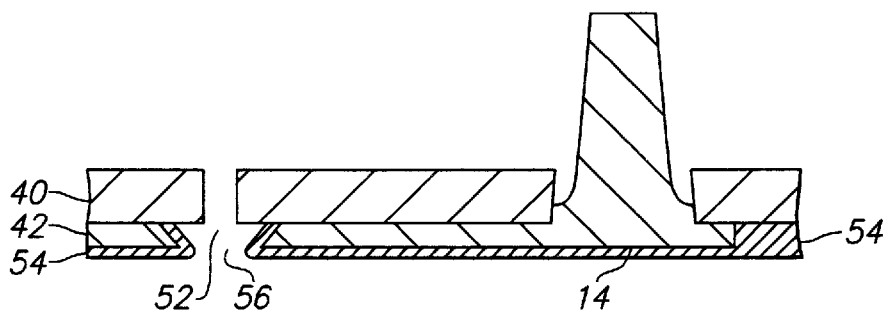
Figure 2L:
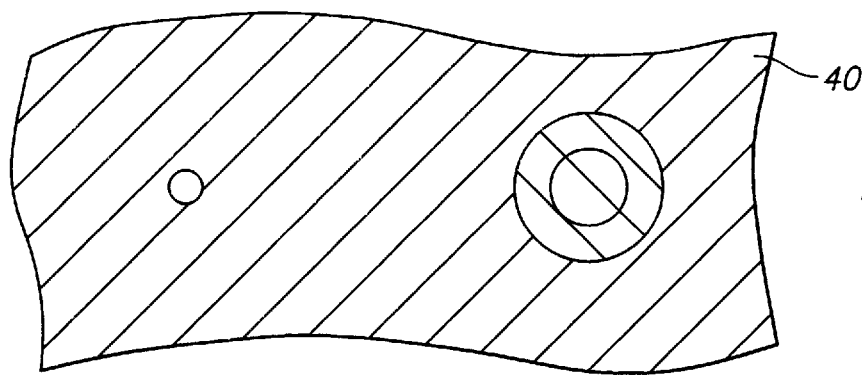
Figure 3L:
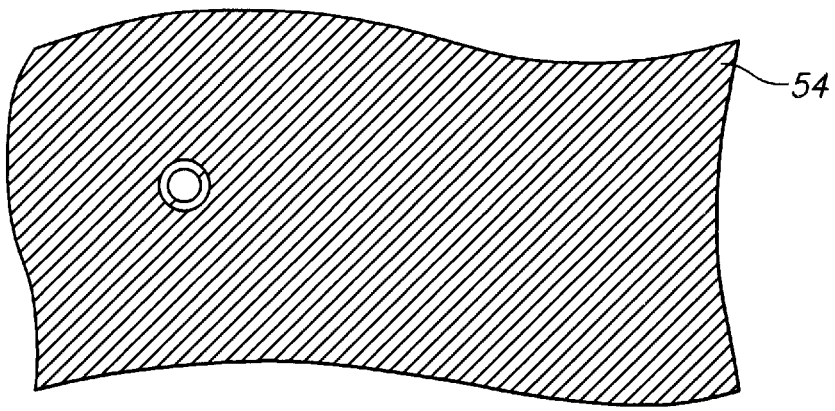

FIGS. 1L, 2L and 3L are cross-sectional, top and bottom views, respectively, of adhesive 54 attached to bottom surface 14. Adhesive 54 is a thermoplastic polyimide film with a glass transition temperature (Tg) of 400° C. Adhesive 54 is applied to bottom surface 14 as a liquid resin such as polyamic acid. The liquid resin is distributed in a controlled manner using screen printing while the structure is inverted so that bottom surface 14 faces upward. The screen (not shown) includes a wire mesh with varying density. The screen allows a relatively thick coating of the liquid resin to surround the outer edges of routing line 42 and contact the bottom surface of insulative base 40 outside routing line 42. The screen also allows a relatively thin coating of the liquid resin to contact routing line 42 along most of bottom surface 14, but allows little or no liquid resin to contact routing line 42 along a small portion of bottom surface 14 adjacent to opening 52. After the screen is removed, the liquid resin flows over the small portion of bottom surface 14 adjacent to opening 52 as well as the tapered sidewalls of opening 52. Thereafter, the liquid resin is cured to form a polyimide film that extends 10 microns beneath bottom surface 14. Adhesive 54 includes opening 56 beneath opening 52. Opening 56 has a diameter of 30 microns (50−10−10). The optimal wire mesh density and liquid resin quantity and viscosity for obtaining the desired liquid resin distribution can be established through trial and error.

Figure 1M:
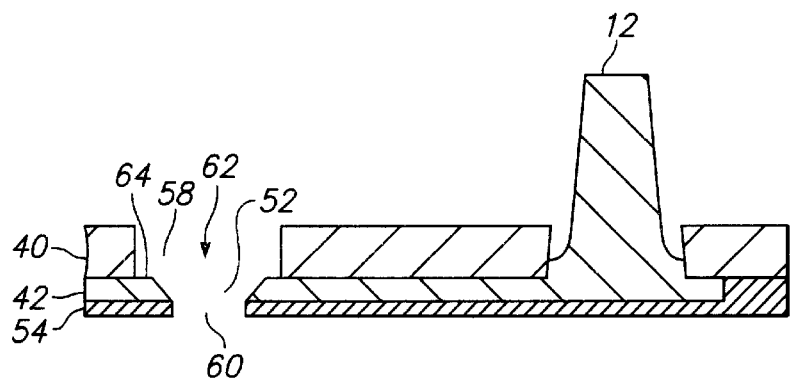
Figure 2M:
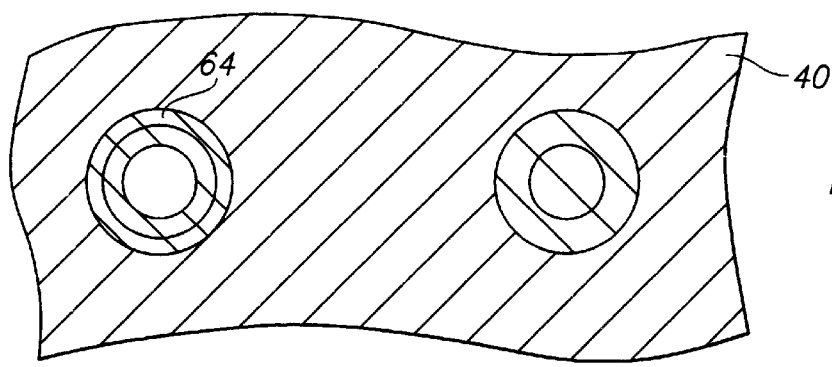
Figure 3M:
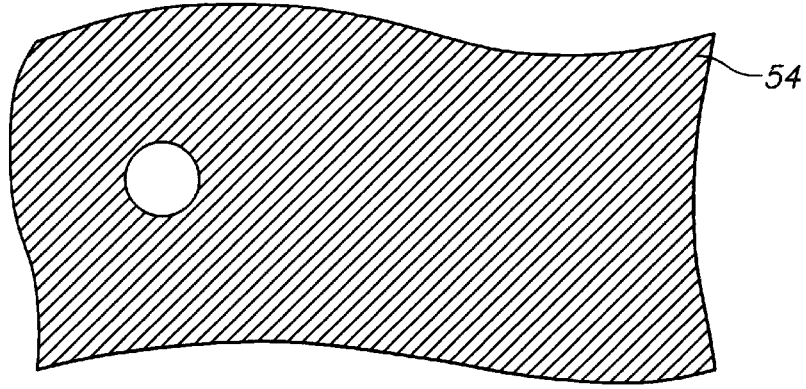

FIGS. 1M, 2M and 3M are cross-sectional, top and bottom views, respectively, of opening 58 formed in insulative base 40 and opening 60 formed in adhesive 54. In particular, a portion of insulative base 40 that surrounds opening 50 is selectively removed to form opening 58, any adhesive 54 in opening 52 is removed, and a portion of adhesive 54 directly below opening 52 is removed to form opening 60. Thus, opening 58 is an enlargement of opening 50, and opening 60 is an enlargement of opening 56. The combination of openings 52, 58 and 60 form through-hole 62 that extends through insulative base 40, routing line 42 and adhesive 54. Openings 58 and 60 can be provided by applying a suitable etch that is highly selective of insulative base 40 and adhesive 54 with respect to routing line 42. The preferred etch depends on the relative thickness of insulative base 40 and adhesive 54. Most etches exhibit little or no selectivity of insulative base 40 with respect to adhesive 54. That is, insulative base 40 and adhesive 54 etch at about the same rate.

In this instance, a selective laser etch is applied. Using projection laser ablation, a metal mask (not shown) is positioned above top surface 12 such that an opening in the metal mask is aligned with opening 52, and a laser is directed to the side of the metal mask opposite top surface 12. Accordingly, the metal mask targets the laser at opening 52. Moreover, the metal mask targets the laser at a region of insulative base 40 that surrounds opening 52 yet is surrounded by enlarged circular region 44. As a result, the laser removes a portion of insulative base 40 within the surface area of circular region 44 that had previously defined opening 50. In this manner, the laser enlarges opening 50 to create opening 58 with a diameter of 130 microns. Opening 58 is substantially axially aligned with enlarged circular region 44 as well as opening 52. Therefore, opening 58 exposes opening 52 as well as ring-shaped portion 64 of the top surface of routing line 42 that is adjacent to opening 52 and was previously covered by insulative base 40. Ring-shaped portion 64 has an annular width of 15 microns ((130−100)/2). Opening 58 and ring-shaped portion 64 are each laterally spaced 10 microns ((150−130)/2) from the peripheral edge (or outer diameter) of enlarged circular region 44. The laser does not deform or remove an appreciable amount of routing line 42. In fact, routing line 42 (and more particularly enlarged circular region 44) is the only portion of the support circuit or adhesive 54 that provides an etch stop for the laser. As a result, the laser essentially provides an extension or pattern transfer of the bottom of opening 52 through adhesive 54, thereby enlarging opening 56 to create opening 60 with a diameter of 50 microns (30+10+10). In this manner, the laser forms openings 58 and 60, or phrased differently, partially forms openings 58 and 60 since the central portions from openings 50 and 56, respectively, were previously formed. Although opening 58 has a larger diameter than that of opening 52, the bottom of opening 52 has an essentially identical diameter to that of opening 60. Moreover, openings 52, 58 and 60 are aligned with one another.

Figure 1N:
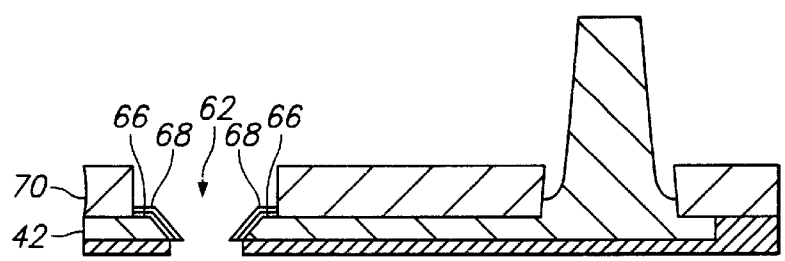
Figure 2N:
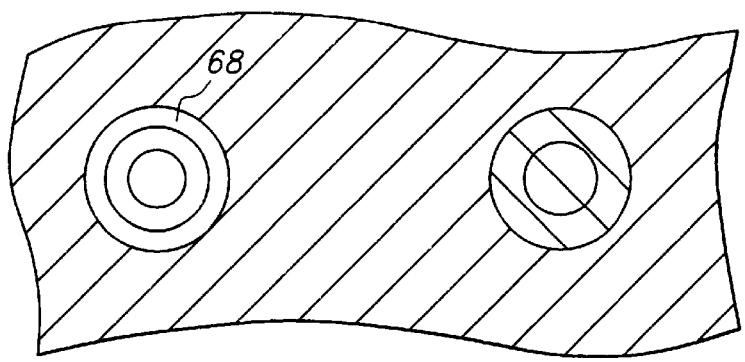
Figure 3N:
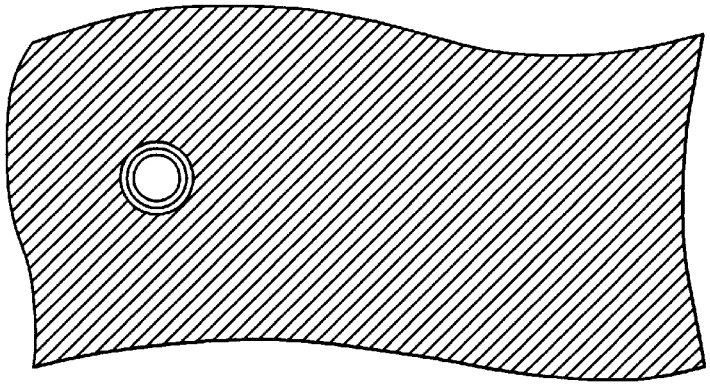

FIGS. 1N, 2N and 3N are cross-sectional, top and bottom views, respectively, of selectively electroplated metal on routing line 42 in through-hole 62. Conductive trace 46 is connected to a plating bus (not shown), current is applied to the plating bus from an external power source, and the structure is submerged in an electrolytic nickel plating solution while a mask (not shown) such as a metal piece coated with an insulator covers pillar 36 and exposes through-hole 62 to the solution. As a result, electroplated nickel 66 with a thickness of 2 microns is deposited (or spot plated) on the exposed portions of routing line 42 in through-hole 62. Thereafter, the structure is removed from the electrolytic nickel plating solution and submerged in an electrolytic silver plating solution while the current is applied to the plating bus and the mask covers pillar 36 and exposes through-hole 62. As a result, electroplated silver 68 with a thickness of 3 microns is deposited (or spot plated) on electroplated nickel 66. Thereafter, the structure is removed from the electrolytic silver plating solution, the current is shut off, and the mask is removed. Accordingly, routing line 42 now includes electroplated nickel 66 and electroplated silver 68, the height of opening 52 is increased by 5 microns, the diameter of opening 52 is narrowed by 10 microns, and the height of opening 58 is decreased by 5 microns. Electroplated silver 68 provides a contact region for routing line 42 inside through-hole 62 that is adapted to receive a gold ball bond as described below, and electroplated nickel 66 provides a barrier layer between the silver and copper portions of routing line 42 that prevents the formation of brittle silver-copper intermetallic compounds.

At this stage, the manufacture of support circuit 70, which includes insulative base 40 and conductive trace 46, can be considered complete. Support circuit 70 is adapted to be mechanically and electrically coupled to a semiconductor chip to form a semiconductor chip assembly. Therefore, for illustration purposes, additional manufacturing steps related to forming a semiconductor chip assembly are described below.

FIGS. 1O–1P, 2O–2P and 3O–3P are cross-sectional, top and bottom views, respectively, of a method of manufacturing a semiconductor chip assembly in accordance with an embodiment of the present invention.

Figure 1O:
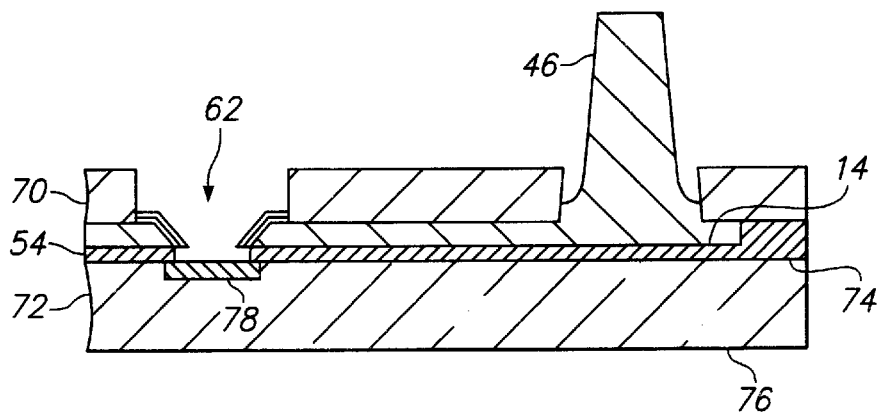
Figure 2O:
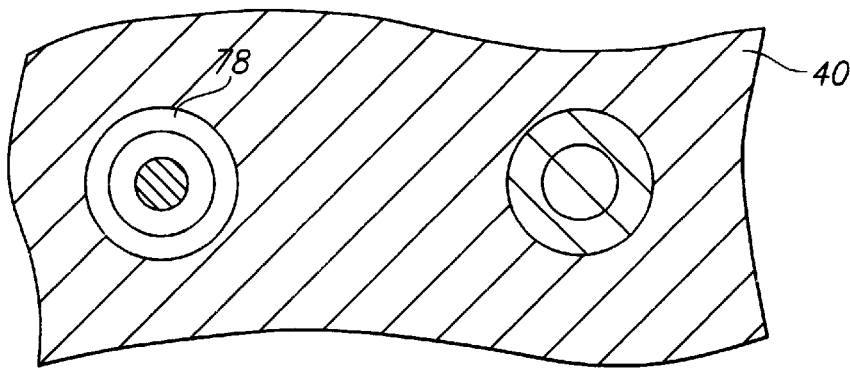
Figure 3O:
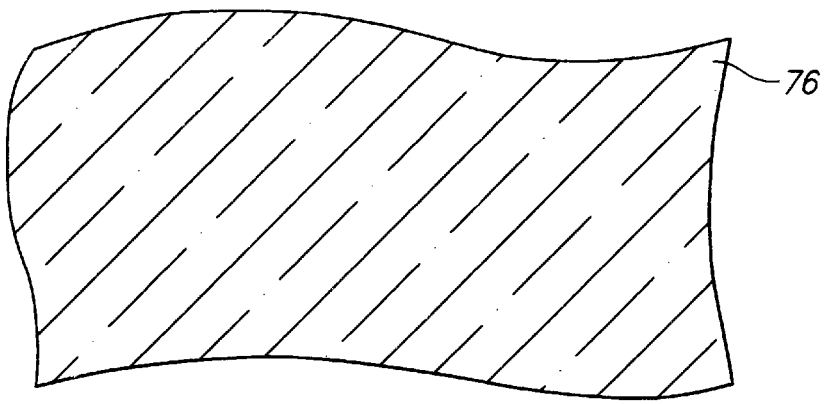

FIGS. 1O, 2O and 3O are cross-sectional, top and bottom views, respectively, of semiconductor chip 72 mechanically attached to support circuit 70 by adhesive 54. Chip 72 is an integrated circuit in which various transistors, circuits, interconnect lines and the like are formed (not shown). Chip 72 includes upper surface 74 and lower surface 76. Upper surface 74 includes conductive pad 78. Pad 78 is substantially aligned with the insulative housing of chip 72 so that upper surface 74 is essentially flat. Alternatively, if desired, pad 78 can extend above or be recessed below the insulative housing. Pad 78 provides a bonding site to electrically couple chip 72 with external circuitry. Thus, pad 78 can be an input/output pad or a power/ground pad. Pad 78 can have an aluminum base that serves as a surface layer, or alternatively, an aluminum base covered by a surface layer such as gold with an adhesion and/or barrier layer therebetween, depending on the nature of a connection joint that shall subsequently contact the pad. If desired, the aluminum base of pad 78 is cleaned by dipping chip 72 in a solution containing 0.05 M phosphoric acid at room temperature for 1 minute and then rinsed in distilled water before depositing the next layer on the aluminum base. Pad 78 has a length and width of 60 microns. Chip 72 includes many other pads on upper surface 74, and only pad 78 is shown for convenience of illustration.

Adhesive 54 is disposed between and contacts upper surface 74 of chip 72 and bottom surface 14 of support circuit 70. Thus, chip 72 and support circuit 70 do not contact one another. Preferably, adhesive 54 is sandwiched between upper surface 74 and bottom surface 14 using relatively low pressure while adhesive 54 is heated to its glass transition temperature and becomes molten. In addition, chip 72 and support circuit 70 are positioned relative to one another so that pad 78 is aligned with through-hole 62. That is, at least a portion of pad 78, and preferably a majority of pad 78, is directly beneath and exposed by through-hole 62. Since the 60 micron length and width of pad 78 exceed the 50 micron diameter of opening 60, all of pad 78 cannot be exposed by through-hole 62. Instead, a central portion of pad 78 is exposed by through-hole 62 and a peripheral portion of pad 78 is covered by adhesive 54. Pad 78 and through-hole 62 can be aligned using an automated pattern recognition system. Thereafter, adhesive 54 is cooled and solidifies to form a solid adhesive layer that is 10 microns thick and mechanically fastens chip 72 to support circuit 70. At this stage, pad 78 is exposed by through-hole 62 but is not electrically connected to conductive trace 46, which is separated from pad 78 by the thickness of adhesive 54.

Figure 1P:
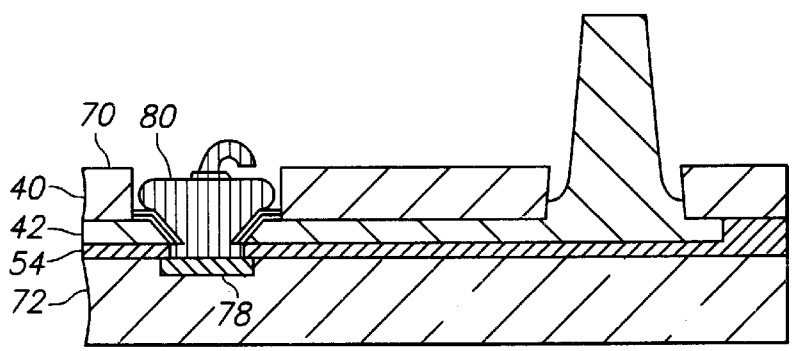
Figure 2P:
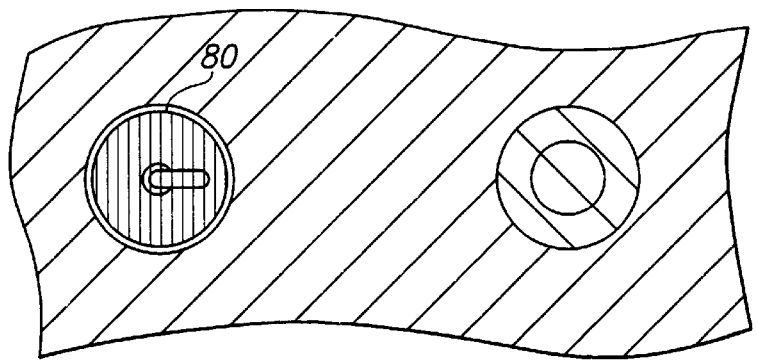
Figure 3P:
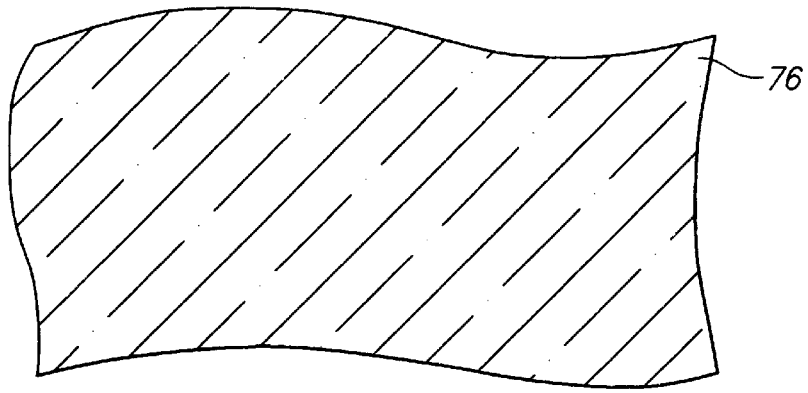

FIGS. 1P, 2P and 3P are cross-sectional, top and bottom views, respectively, of the semiconductor chip assembly after ball bond connection joint 80 is formed. Ball bond connection joint 80 is formed in through-hole 62, extends through opening 60 in adhesive 54, and contacts pad 78 and routing line 42, thereby electrically connecting pad 78 and routing line 42. Ball bond connection joint 80 is composed of gold and is formed by thermosonic wire bonding, although thermocompression wire bonding can also be used. Ball bond connection joint 80 fills openings 52 and 60 and extends into opening 58 but does not contact insulative base 40. Thus, the sidewalls of opening 58 remain exposed and devoid of metal. Moreover, ball bond connection joint 80 only contacts portions of pad 78, routing line 42 and adhesive 54 exposed by through-hole 62 and is the only electrical conductor in through-hole 62. Ball bond connection joint 80 provides a robust, permanent electrical connection between pad 78 and routing line 42. Further details about a ball bond connection joint are described in U.S. application Ser. No. 091665,928, filed Sep. 20, 2000 by Charles W. C. Lin entitled "Semiconductor Chip Assembly with Ball Bond Connection Joint" which is incorporated by reference.

Support circuit 70 includes other conductive traces embedded in insulative base 40, and only a single conductive trace 46 is shown for convenience of illustration. The conductive traces are electrically isolated from one another by insulative base 40 except for possibly a plating bus and related circuitry that is disconnected or severed after the last electroplating operation is complete.

Figure 4:
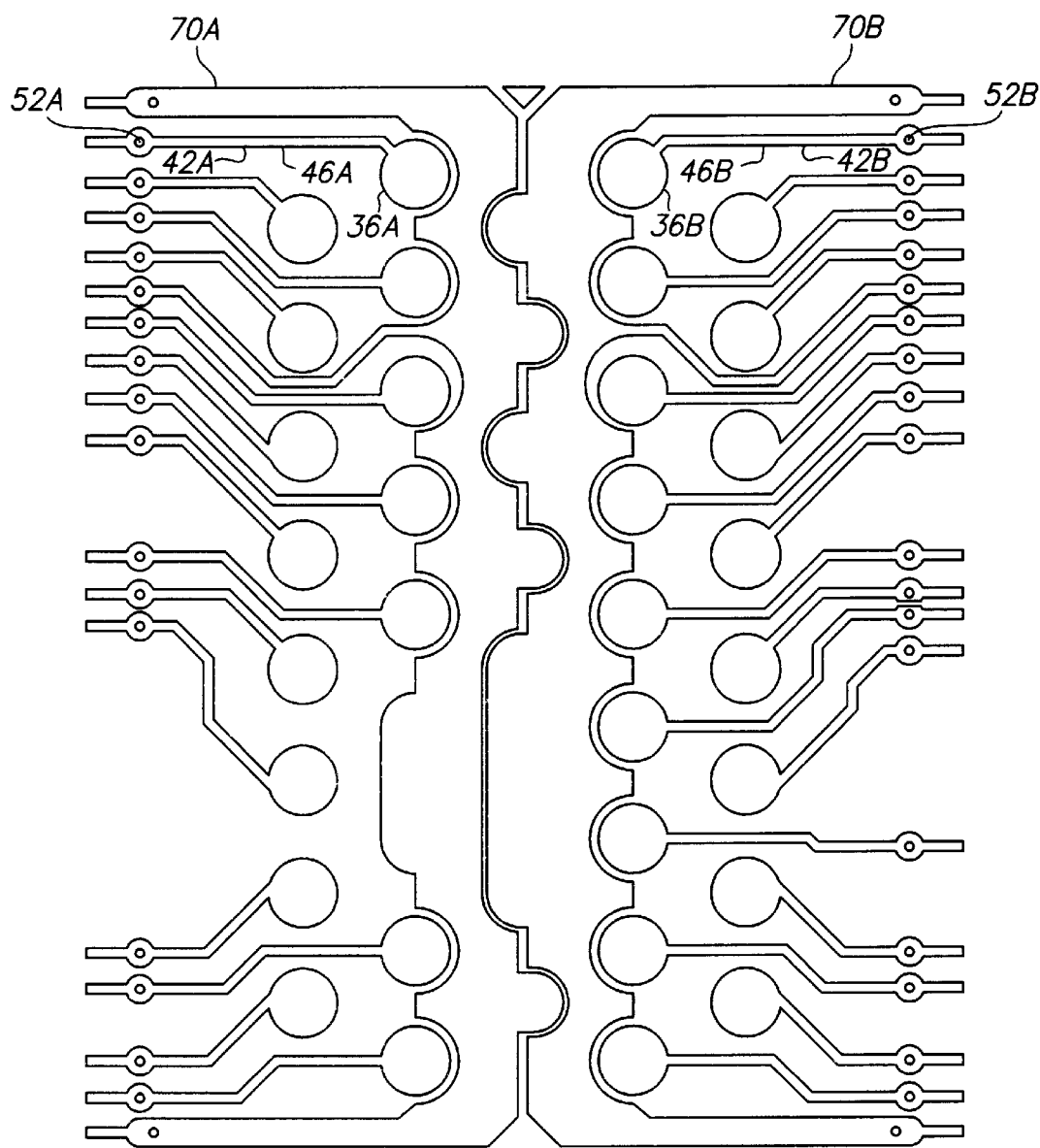
FIG. 4 is an enlarged bottom plan view of portions of adjacent support circuits in accordance with an embodiment of the present invention.

FIG. 4 is an enlarged bottom plan view of portions of adjacent support circuits 70A and 70B manufactured in accordance with the present invention. Support circuits 70A and 70B each include a plurality of conductive traces 46A and 46B, respectively. Conductive traces 46A and 46B include pillars 36A and 36B, routing lines 42A and 42B, and openings 52A and 52B, respectively.

The support circuit described above is merely exemplary. Numerous other embodiments are contemplated.

The conductive trace can have various shapes and sizes and can be various conductive metals including copper, gold, nickel, aluminum, tin, combinations thereof and alloys thereof. Of common metallic materials, copper has especially low resistivity and cost. Furthermore, those skilled in the art will understand that in the context of a support circuit, a copper conductive trace is typically a copper alloy that is mostly copper but not pure elemental copper, such copper-zirconium (99.9% copper), copper-silver-phosphorus-magnesium (99.7% copper), or copper-tin-iron-phosphorus (99.7% copper). The conductive trace may be compatible with receiving the connection joint before the opening in the routing line is formed, thereby obviating the need for spot plated metal on the routing line before the connection joint is formed. The conductive trace may function as a signal, power or ground layer depending on the purpose of the associated chip pad. The conductive trace need not necessarily extend above the top surface of the insulative base, and the top portion of the conductive trace can be a ball, a pad, or a pillar (columnar post). A pillar is particularly well-suited for reducing thermal mismatch related stress in the next level assembly.

The pillar and the through-hole can have a circular, ovular, square, rectangular or other shape (as viewed from the top surface of the support circuit). Furthermore, the pillar and through-hole sidewalls may have a wide variety of shapes and slopes including vertical sidewalls, tapered sidewalls, continuous sidewalls and stepped sidewalls.

Preferably, the insulative base has a thickness of 25 to 50 microns, the routing line has a width of 10 to 100 microns and a thickness of 10 to 40 microns, the pillar has a diameter of 300 to 500 microns that decreases with increasing height, a height of 150 to 300 microns and extends 50 to 250 microns above the insulative base, and the through-hole has a diameter of 50 to 100 microns. Of course, other dimensions are suitable.

The through-hole may be formed completely or partially either before or after mechanically attaching the chip to the support circuit. For instance, an etch can be applied through the opening in the routing line to form the opening in the adhesive before or after the adhesive contacts the chip. See, for instance, U.S. application Ser. No. 09/643,445, filed Aug. 22, 2000 by Charles W. C. Lin entitled "Method of Making a Semiconductor Chip Assembly" which is incorporated by reference.

Likewise, the opening in the adhesive can be formed by the same etch that enlarges the opening in the insulative base or by a subsequent etch such as a brief blanket plasma etch that is applied to the adhesive through the enlarged opening in the insulative base and the opening in the routing line. The plasma etch would also remove a top portion of the insulative base. Since, however, the insulative base is quite thick relative to the adhesive, and the plasma etch is briefly applied, it is not critical that the plasma etch be highly selective of the adhesive with respect to the insulative base, and no appreciable amount of the insulative base would be removed.

The insulative base may be rigid or flexible, and may be formed from numerous organic or inorganic insulators such as tape (polyimide), epoxy, silicone, glass (aramid) and ceramic. Organic insulators are preferred for low cost, high dielectric applications, whereas inorganic insulators are preferred when high thermal dissipation and a matched thermal coefficient of expansion are important. The insulative base can be deposited only on the recessed portion, or alternatively, deposited over the pillar and the recessed portion and then etched back so that a top portion of the pillar is exposed.

Numerous etch masks can be used to define the pillar and the routing line. For instance, the photoresist layers need not necessarily be applied or patterned simultaneously. For feature sizes of 25 microns or less, a spin coated liquid photoresist may be preferable to a dry film photoresist since the liquid photoresist can be thinner. Furthermore, if the photoresist can withstand the temperature at which the insulative base is cured (or the insulative base need not be cured) then metal etch masks may not be necessary. In this instance, photoresist layers 16 and 18 can provide the etch masks that define portions 32 and 34, respectively, of top and bottom surfaces 12 and 14, respectively, thereby avoiding the need for nickel etch masks 26 and 28. Moreover, if thin conductive metal etch masks such as nickel or gold are used, it may not be necessary to strip the etch masks after forming the pillar and routing line. In fact, it may be desirable to leave nickel etch masks on a copper conductive trace in order to protect the underlying copper from corrosion as long as an etch is applied through the opening in the routing line to form a corresponding opening in the bottom nickel etch mask. Suitable metal etch masks include nickel, gold, tin, tin-nickel and tin-lead (solder).

Numerous adhesives can be applied to the bottom surface of the support circuit after the routing line is formed. For instance, the adhesive can be applied as a paste, a laminated layer, or a liquid applied by screen-printing, spin-on, or spray-on. If a paste or liquid adhesive is applied, the adhesive may contact the insulative base and fill the opening in the routing line, although the laser etch would remove adhesive in the opening in the routing line. If a laminated adhesive is applied then no appreciable amount of adhesive may contact the insulative base or reside inside the opening in the routing line. Thermosetting adhesive liquids and pastes are generally suitable if they need not be exposed to an electrolytic plating bath. For instance, the adhesive can be applied as a liquid or paste (A stage) to the bottom surface of the support circuit, the adhesive can be partially cured (B stage), an etch can form the opening in the adhesive, the partially cured adhesive can be brought into contact with the chip, thereby exposing the pad through the through-hole, and then the adhesive can be fully cured (C stage). Alternatively, the liquid or paste adhesive can be sandwiched between the chip and the support circuit, the adhesive can be fully cured thereby mechanically fastening the chip to the support circuit, and then the etch can form the opening in the adhesive thereby exposing the pad through the through-hole.

Numerous etches can be applied to form the pillar and the routing line and the openings in the routing line, the insulative base and the adhesive. For instance, the openings in the insulative base and the adhesive can be formed by laser direct write (without a mask). In addition, these etches can be performed in various sequences. For instance, the etch that forms the opening in the routing line (or recessed portion) can be applied before or after the etch that forms the routing line in the recessed portion. Likewise, the etch that forms the opening in the insulative base can be applied before or after the etch that forms the routing line in the recessed portion.

The connection joint can be formed from a wide variety of materials including copper, gold, nickel, palladium, tin, alloys thereof, and combinations thereof, can be formed by a wide variety of processes including electroplating, electroless plating, ball bonding and solder reflow, and can have a wide variety of shapes as sizes. The choice between a connection joint that partially or completely fills the through-hole and the shape of the connection joint depends on design and reliability considerations. Further details regarding an electroplated connection joint are disclosed in U.S. application Ser. No. 09/643,212, filed Aug. 22, 2000 by Charles W. C. Lin entitled "Semiconductor Chip Assembly with Simultaneously Electroplated Contact Terminal and Connection Joint" which is incorporated by reference. Further details regarding an electrolessly plated connection joint are disclosed in U.S. application Ser. No. 09/643,214, filed Aug. 22, 2000 by Charles W.C. Lin entitled "Semiconductor Chip Assembly with Simultaneously Electrolessly Plated Contact Terminal and Connection Joint" which is incorporated by reference.

After the connection joint is formed, further encapsulation can be performed but is generally not necessary. In particular, it is not necessary to fill a conductor or insulator into whatever space remains in the through-hole or to deposit an insulator over the insulative base. However, in the event the insulative base is thin, it may be desirable to provide an encapsulant to enhance the mechanical strength of the support circuit.

After the connection joint is formed, a soldering material or solder ball can be deposited over the pillar by plating or printing or placement techniques if required for the next level assembly. However, the next level assembly may not require that the semiconductor chip assembly contain solder. For instance, in land grid array (LGA) packages, the soldering material is normally provided by the panel rather than the contact terminals on the semiconductor chip assembly.

After the connection joint is formed, if a plating bus exists then it is disconnected from the conductive trace. The plating bus can be disconnected by mechanical sawing, laser cutting, chemical etching, and combinations thereof. If the plating bus is disposed about the periphery of the assembly but is not integral to the assembly, then the plating bus can be disconnected when the assembly is singulated from other assemblies. However, if the plating bus is integral to the assembly, then prior to singulation a photolithography step can be added to selectively cut related circuitry on the assembly that is dedicated to the plating bus since this circuitry would otherwise short the conductive traces together.

The working format for the support circuit can be a single chip, a wafer, a strip or a panel based on the manufacturing design. For instance, when the working format is a wafer, numerous support circuits are simultaneously batch manufactured on a single wafer and then separated from one another during singulation. As another example, when the working format is a strip (or reel-to-reel) form, numerous support circuits are manufactured on a strip before the chips are individually attached to support circuits. Semiconductor chip assemblies manufactured using a strip can be chip size packages, ball grid arrays, or other structures. The wafer-based approach employs fewer steps and is less time consuming than the strip-based approach, however the strip-based approach is easier to control and has better dimensional stability than the wafer-based approach since aligning the through-holes with the pads involves a single chip and a single support circuit rather than the entire wafer and numerous support circuits.

Advantageously, the support circuit of the present invention is reliable and inexpensive. The insulative base protects the conductive trace from handling damage, provides a known dielectric barrier for the conductive trace, and prevents solder reflow at the top surface of the support circuit from contacting or electrically shorting the underlying routing line. The tapered sidewalls of the opening in the routing line are particularly well-suited for receiving a ball bond connection joint and preventing trapped air as the capillary compresses a wire ball into the through-hole. The tapered pillar yields enhanced reliability for the next level assembly that exceeds that of conventional BGA packages. Furthermore, the support circuit can provide mechanical and metallurgical coupling with a chip without TAB, flip-chip bonding, polishing, or solder joints. As a result, the support circuit of the present invention significantly enhances throughput, yield and performance characteristics compared to conventional packaging techniques. Moreover, the support circuit of the present invention is well-suited for use with materials compatible with copper chip and lead free environmental requirements.

Various changes and modifications to the presently preferred embodiments described herein will be apparent to those skilled in the art. For instance, the materials, dimensions and shapes described above are merely exemplary. Such changes and modifications may be made without departing from the spirit and scope of the present invention as defined in the appended claims.

I claim:

1. A method of manufacturing a support circuit, comprising:

providing a conductive layer with top and bottom surfaces;

providing a top etch mask on the top surface that includes an opening that exposes a portion of the top surface;

providing a bottom etch mask on the bottom surface that includes an opening that exposes a portion of the bottom surface;

applying an etch to the exposed portion of the top surface through the opening in the top etch mask, thereby etching partially but not completely through the conductive layer and forming a recessed portion in the conductive layer below the top surface;

forming an insulative base on the recessed portion without forming the insulative base on the top surface;

applying an etch to the exposed portion of the bottom surface through the opening in the bottom etch mask, thereby forming a routing line in the recessed portion;

applying an etch to the insulative base to form an opening in the insulative base that exposes a portion of the recessed portion;

applying an etch to the exposed portion of the recessed portion through the opening in the insulative base, thereby forming an opening in the recessed portion with tapered sidewalls; and providing an opening in the routing line using the opening in the recessed portion.

2. The method of claim 1, including providing the top and bottom etch masks simultaneously.

3. The method of claim 1, including providing the top and bottom etch masks during a single electroplating operation.

4. The method of claim 1, including removing the top and bottom etch masks simultaneously.

5. The method of claim 1, including applying the etch to the exposed portion of the top surface and then applying the etch to the exposed portion of the bottom surface.

6. The method of claim 1, including applying the etch to the exposed portion of the bottom surface and then applying the etch to the exposed portion of the recessed portion.

7. The method of claim 1, including providing the insulative base and then applying the etch to the exposed portion of the bottom surface.

8. The method of claim 1, including applying the etch to the exposed portion of the bottom surface and then forming the opening in the insulative base.

9. The method of claim 1, including applying the etch to the exposed portion of the top surface, then providing the insulative base, then applying the etch to the exposed portion of the bottom surface, then providing the opening in the insulative base, then applying the etch to the exposed portion of the recessed portion.

10. The method of claim 1, including applying an etch that enlarges the opening in the insulative base after forming the opening in the recessed portion.

11. The method of claim 10, wherein applying the etch that enlarges the opening in the insulative base exposes a portion of a top surface of the routing line adjacent to the tapered sidewalls and exposes an upper portion of the tapered sidewalls.

12. The method of claim 10, wherein applying the etch that enlarges the opening in the insulative base also at least partially forms an opening in an adhesive layer that is below the opening in the routing line.

13. The method of claim 10, including electroplating a metal onto the exposed portion of the top surface of the routing line and the tapered sidewalls before attaching the support circuit to a chip.

14. The method of claim 1, wherein the opening in the routing line has a diameter that increases with increasing height, and the tapered sidewalls have a slope of about 45 to 75 degrees.

15. The method of claim 1, wherein applying the etch to the exposed portion of the top surface forms a pillar in the conductive layer, and forming the insulative base allows the pillar to extend above the insulative base.

16. The method of claim 15, wherein the pillar has a diameter that is narrowest at the top surface.

17. The method of claim 15, wherein the routing line provides horizontal routing between the pillar and the opening in the routing line.

18. The method of claim 1, wherein applying the etches to the exposed portion of the top surface, the exposed portion of the bottom surface and the exposed portion of the recessed portion includes applying separate wet chemical etches, and applying the etch to the insulative base includes applying a laser etch.

19. The method of claim 1, wherein the conductive layer is a copper foil.

20. The method of claim 1, wherein the insulative base is epoxy.

21. A method of manufacturing a support circuit, comprising:

providing a conductive metal layer with top and bottom surfaces;

providing a top etch mask on the top surface and a bottom etch mask on the bottom surface, wherein the top etch mask includes an opening that exposes a portion of the top surface, and the bottom etch mask includes an opening that exposes a portion of the bottom surface;

applying an etch to the exposed portion of the top surface through the opening in the top etch mask, thereby etching partially but not completely through the conductive metal layer and forming a recessed portion in the conductive metal layer below the top surface;

forming an insulative base on the recessed portion that does not extend to the top surface;

applying an etch to the exposed portion of the bottom surface through the opening in the bottom etch mask, thereby forming a routing line in the recessed portion that is covered by the insulative base;

applying an etch to the insulative base for form an opening in the insulative base that exposes a portion of the routing line;

applying an etch to the exposed portion of the routing line through the opening in the insulative base to form an opening in the routing line with tapered sidewalls, wherein the opening in the routing line has a diameter which increases with increasing height, and a portion of a top surface of the routing line adjacent to an upper portion of the sloped sidewalls and the upper portion of the sidewalls are covered by the insulative base; and applying an etch to the insulative base to enlarge the opening in the insulative base, wherein the enlarged opening in the insulative base exposes the portion of the top surface of the routing line and the upper portion of the sidewalls.

22. The method of claim 21, including providing the top and bottom etch masks simultaneously, and then removing the top and bottom etch masks simultaneously.

23. The method of claim 21, wherein the enlarged opening in the insulative base and the opening in the routing line provide a through-hole that extends through the support circuit.

24. The method of claim 21, including providing an adhesive beneath the routing line, wherein applying the etch that enlarges the opening in the insulative base also at least partially forms an opening in the adhesive directly beneath the opening in the routing line.

25. The method of claim 21, wherein the steps are performed in the sequence set forth.

26. The method of claim 21, wherein applying the etch to the exposed portion of the top surface forms a pillar in the conductive metal layer, and the routing line provides horizontal routing between the pillar and the opening in the routing line.

27. The method of claim 26, wherein the pillar is tapered and has a diameter that decreases as a height of the pillar increases and is narrowest at the top surface.

28. The method of claim 26, wherein the pillar extends a first distance above the routing line, the insulative base extends a second distance above the routing line, and the first distance is at least twice the second distance.

29. The method of claim 21, wherein the conductive metal layer is a copper foil.

30. The method of claim 21, wherein the insulative base is epoxy.

31. A method of manufacturing a support circuit, comprising the following steps in the sequence set forth:

providing a conductive metal layer with top and bottom surfaces;

providing a top etch mask on the top surface and a bottom etch mask on the bottom surface, wherein the top etch mask includes an opening that exposes a portion of tie top surface, and the bottom etch mask includes an opening that exposes a portion of the bottom surface;

applying an etch to the exposed portion of the top surface through the opening in the top etch mask, thereby etching partially but not completely through the conductive metal layer, so as to form a pillar in the conductive metal layer that tapers and has a narrowest diameter at the top surface and form a recessed portion in the conductive metal layer below the top surface;

forming an insulative base on the recessed portion such that the pillar extends above the insulative base and the insulative base covers the recessed portion;

applying an etch to the exposed portion of the bottom surface through the opening in the bottom etch mask, thereby etching completely through the recessed portion to form a routing line in the recessed portion, and applying an etch to the insulative base to form an opening in the insulative base that exposes a portion of the routing line;

applying an etch to the exposed portion of the routing line through the opening in the insulative base to form an opening in the routing line with tapered sidewalls such that a diameter of the opening in the routing line increases as a height of the opening in the routing line increases and a portion of a top surface of the routing line adjacent to the tapered sidewalls is covered by the insulative base; and applying an etch that enlarges the opening in the insulative base, wherein the enlarged opening in the insulative base exposes the portion of the top surface of the routing line adjacent to the tapered sidewalls.

32. The method of claim 31, including providing the top and bottom etch masks simultaneously, and then removing the top and bottom etch masks simultaneously.

33. The method of claim 31, including applying the etch to the exposed portion of the bottom surface and then applying the etch to the insulative base to form the opening in the insulative base that exposes the portion of the routing line.

34. The method of claim 31, including covering the bottom surface with an adhesive, and then applying the etch that enlarges the opening in the insulative base through the opening in the routing line to at least partially form an opening in the adhesive.

35. The method of claim 31, wherein the pillar extends a first distance above the routing line, the insulative base extends a second distance above the routing line, and the first distance is at least twice the second distance.

36. The method of claim 31, wherein the tapered sidewalls have a slope of about 45 to 75 degrees.

37. The method of claim 31, wherein the conductive metal layer is copper, and the insulative base is epoxy.

38. The method of claim 31, wherein the method excludes polishing.

39. The method of claim 31, wherein the support circuit is devoid of wire bonds, TAB leads, and solder joints.

40. The method of claim 31, wherein the support circuit is adapted for a semiconductor chip assembly.

41. A method of manufacturing a support circuit, comprising the following steps in the sequence set forth:

providing a copper layer with top and bottom surfaces;

providing a top etch mask on the top surface and a bottom etch mask on the bottom surface, wherein the top etch mask includes an opening that exposes a portion of the top surface, and the bottom etch mask includes an opening that exposes a portion of the bottom surface;

applying a wet chemical etch to the exposed portion of the top surface through the opening in the top etch mask, thereby etching partially but not completely through the copper layer, so as to form a pillar in the copper layer that extends to the top surface and a recessed portion in the copper layer below the top surface;

forming an insulative base on the recessed portion such that the pillar extends above the insulative base and the insulative base covers the recessed portion;

applying an etch to the exposed portion of the bottom surface through the opening in the bottom etch mask, thereby etching completely through the recessed portion, so as to form a routing line in the recessed portion that extends to the bottom surface and is covered by the insulative base, wherein the pillar extends a first distance above the routing line, the insulative base extends a second distance above the routing line, and the first distance is at least twice the second distance;

applying a wet chemical etch through an opening in the insulative base to form an opening in the routing line with tapered sidewalls such that a diameter of the opening in the routing line increases as a height of the opening in the routing line increases and a portion of a top surface of the routing line adjacent to an upper portion of the tapered sidewalls and the upper portion of the tapered sidewalls are covered by the insulative base; and enlarging the opening in the insulative base such that the portion of the top surface of the routing line and the upper portion of the tapered sidewalls are directly beneath and exposed by the enlarged opening.

42. The method of claim 41, including applying a first laser etch to the insulative base to form the opening in the insulative base, and applying a second laser etch to the insulative base to form the enlarged opening in the insulative base.

43. The method of claim 42, including disposing an adhesive beneath the bottom surface, and applying the second laser etch through the opening in the insulative base and the opening in the routing line to at least partially form an opening in the adhesive, thereby providing a through-hole that consists of the enlarged opening in the insulative base, the opening in the routing line and the opening in the adhesive.

44. The method of claim 41, including electroplating a metal over the portion of the top surface of the routing line and the tapered sidewalls after enlarging the opening and before attaching the support circuit to a chip.

45. The method of claim 44, wherein the electroplated metal is adapted to receive a gold ball bond provided by wire bonding.

46. The method of claim 41, wherein the pillar has a flat top surface and a diameter that is narrowest at the flat top surface and a taper that extends from the flat top surface to the routing line.

47. The method of claim 41, wherein the tapered sidewalls have a slope of about 45 to 75 degrees.

48. The method of claim 41, wherein the method excludes polishing.

49. The method of claim 41, wherein the support circuit is devoid of wire bonds, TAB leads, and solder joints.

50. The method of claim 41, wherein the support circuit is adapted for a semiconductor chip assembly.

\* \* \* \* \*